US012739985B2

(12) United States Patent
Yan et al.

(10) Patent No.: US 12,739,985 B2

(45) Date of Patent: Sep. 15, 2026

(54) POWER GENERATION SYSTEM, POWER CONVERTER, AND SWITCH ASSEMBLY

(71) Applicant: Huawei Digital Power Technologies Co., Ltd., Shenzhen (CN)

(72) Inventors: Yang Yan, Shenzhen (CN); Weijia Yan, Shenzhen (CN); Zhaoqi Cai, Shenzhen (CN); Gun Yang, Shenzhen (CN); Yiyang He, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 173 days.

(21) Appl. No.: 18/885,907

(22) Filed: Sep. 16, 2024

(65) Prior Publication Data

US 2025/0098082 A1 Mar. 20, 2025

(30) Foreign Application Priority Data

Sep. 18, 2023 (CN) ........................ 202311205062.1

(51) Int. Cl.

*H01H 19/14* (2006.01)

*H05K 1/181* (2026.01)

(Continued)

(52) U.S. Cl.

CPC ........... *H05K 5/0217* (2013.01); *H01H 19/14* (2013.01); *H05K 1/181* (2013.01); *H05K 5/03* (2013.01);

(Continued)

(58) Field of Classification Search

CPC ........ H02M 3/073; H02M 3/137; H02M 3/28; H02M 3/315; H02M 3/3155; H02M 3/325;

(Continued)

(56) References Cited

U.S. PATENT DOCUMENTS

2010/0097765 A1* 4/2010 Suzuki .............. H05K 7/20927 361/699

2018/0006470 A1* 1/2018 Stacey ...................... H02J 7/50

(Continued)

FOREIGN PATENT DOCUMENTS

CN 207283417 U 4/2018

CN 209709960 U 11/2019

(Continued)

*Primary Examiner* — Crystal L Hammond

*Assistant Examiner* — Nusrat Quddus

(74) *Attorney, Agent, or Firm* — Maier & Maier, PLLC

(57) ABSTRACT

A power generation system, a power converter, and a switch assembly. The plurality of positive input ports and the plurality of negative input ports are configured to electrically connect the switch assembly to an external direct current source, and the switch assembly is electrically connected to the power device through a trace on the circuit mainboard. The switch assembly includes a plurality of first pins and a plurality of second pins, the plurality of first pins are located in a first region, the plurality of second pins are located in a second region, the first region and the second region are stacked in a first direction. The controller is configured to send a switch-off signal to the switch assembly when the external direct current source or the power device is faulty. The power converter provided can resolve a problem of a short circuit occurring during condensation.

20 Claims, 15 Drawing Sheets

(51) Int. Cl.
*H05K 5/02* (2006.01)
*H05K 5/03* (2006.01)
*H05K 7/14* (2006.01)

(52) U.S. Cl.
CPC . *H05K 7/1427* (2013.01); *H05K 2201/10151* (2013.01)

(58) Field of Classification Search
CPC ........ H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/04; H02M 7/00; H02M 5/40; H02M 5/42; H02M 5/453; H02M 7/7575; H02M 5/458; H02M 5/45; H02M 5/4585; H02M 5/4505; H02M 5/451; H02M 5/452; H02M 5/447; H02M 5/456; H02M 1/12; H02M 1/4266; H02M 2001/123; H02M 1/10; H02M 3/33561; H02M 7/003; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02H 7/261; H02H 7/268; H02J 3/36; H02J 3/01; H01H 19/08; H01H 19/64; H01H 1/5805; H01H 23/006; H01H 15/005; H01H 2001/5811; H01H 2001/5816; H01H 9/342; H01H 1/365; H01H 1/58; H01H 33/182; H01H 33/185; H01H 33/53; H01H 33/62; H05K 7/14322; H05K 7/20927; G06F 1/263; H01L 25/112; H01L 25/115; H01L 23/34; H01R 13/6675; H01R 29/00; H01R 31/065; G09G 3/20; H02K 11/046; H01F 2027/406; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H05B 39/048; B23K 11/24; H04B 2215/069
See application file for complete search history.

(56) References Cited

U.S. PATENT DOCUMENTS

| | | | | |
|---|---|---|---|---|
| 2020/0053900 | A1* | 2/2020 | Feurtado | H02M 7/003 |
| 2022/0354014 | A1* | 11/2022 | Feurtado | H05K 7/1432 |
| 2023/0238200 | A1* | 7/2023 | Chang | H01H 19/64 218/23 |
| 2023/0417375 | A1* | 12/2023 | Wu | F21K 9/64 |
| 2024/0242871 | A1* | 7/2024 | Zeng | H01F 27/2804 |
| 2025/0340429 | A1* | 11/2025 | Jenkins | B67D 7/42 |

FOREIGN PATENT DOCUMENTS

| | | | |
|---|---|---|---|
| CN | 114649160 | A | 6/2022 |
| CN | 115101368 | A | 9/2022 |
| EP | 4210082 | A1 | 7/2023 |

* cited by examiner

POWER GENERATION SYSTEM, POWER CONVERTER, AND SWITCH ASSEMBLY

CROSS-REFERENCE TO RELATED APPLICATION

This application claims priority to Chinese Patent Application No. 202311205062.1, filed on Sep. 18, 2023, which is hereby incorporated by reference in its entirety.

TECHNICAL FIELD

The embodiments relate to the field of photovoltaic technologies and to a power generation system, a power converter, and a switch assembly.

BACKGROUND

Solar energy is gradually applied to various industries today, and an increasing quantity of power station users, industrial and commercial users, and home users choose photovoltaic inverters. People have increasingly strict requirements on safety of inverters, and have further requirements on aesthetics and miniaturization of products.

In a related technology, an isolating switch in a power converter includes a plurality of layers of breaking units. Each layer of breaking unit breaks one polarity. Positive and negative polarities are arranged alternately. The breaking switch is prone to condensation. Because the layers of breaking units are close to each other, condensation may easily lead to a short circuit between positive and negative electrodes, and even a photovoltaic module may be burnt out in a severe case.

SUMMARY

Embodiments provide a power generation system, a power converter, and a switch assembly, to resolve a problem of a short circuit occurring during condensation.

According to a first aspect, an embodiment provides a power generation system, including a plurality of positive input ports, a plurality of negative input ports, a switch assembly, a circuit mainboard, a power device, and a controller. The plurality of positive input ports and the plurality of negative input ports are configured to electrically connect the switch assembly to an external direct current source, the power device is disposed on the circuit mainboard, and the switch assembly is electrically connected to the power device through a trace on the circuit mainboard. The switch assembly includes a plurality of first pins and a plurality of second pins, the plurality of first pins are located in a first region, the plurality of second pins are located in a second region, the first region and the second region are stacked in a first direction, the first pin is electrically connected to the positive input port, and the second pin is electrically connected to the negative input port. The controller is configured to send a switch-off signal to the switch assembly when the external direct current source or the power device is faulty, to disconnect a circuit between the plurality of positive input ports and the power device or a circuit between the plurality of negative input ports and the power device.

In this embodiment, a current of the external direct current source flows from an input connector to the power device, and a current converted by the power device is output to an external load, to form a working path of the power generation system. The switch assembly is disposed on the working path, and is located between the external direct current source and the power device, to implement connection or disconnection of the working path. Normal working of the switch assembly on the working path has important impact on safety of the external direct current source and a power converter. The plurality of first pins are distributed in a same region, and the plurality of second pins are distributed in a same region. When condensation occurs, no short circuit occurs even if two adjacent first pins are connected by condensation, and the working path of the power generation system can still run normally, to avoid damage caused by a short circuit to the power converter. Similarly, the plurality of second pins are a same polarity. When condensation occurs, no short circuit occurs even if two adjacent second pins are connected by condensation. In addition, because no short circuit occurs between adjacent first pins and between adjacent second pins even if condensation occurs, reducing a creepage distance between two adjacent first pins and a creepage distance between two adjacent second pins can effectively reduce a volume of the switch assembly. In addition, because the plurality of first pins are distributed in a same region, and the plurality of second pins are distributed in a same region, a monitoring solution and a structure solution may be designed for the switch assembly in this embodiment based on a difference between a positive polarity monitoring direction and a negative polarity monitoring direction, to improve diversity of a structure design of the switch assembly.

In some embodiments, a first pin closest to the second region in the first region is a pin 1, a second pin closest to the first region in the second region is a pin 2, and the pin 1 and the pin 2 are disposed in a staggered manner in the first direction. "Disposed in a staggered manner" may be understood as follows: in the first direction, the pin 1 and the pin 2 are staggered and not arranged in a column.

In this embodiment, the first pin closest to the second region in the first region and the second pin closest to the first region in the second region are disposed in a staggered manner in the first direction, so that a creepage distance between the first pin closest to the second region in the first region and the second pin closest to the first region in the second region can be increased, to effectively prevent a short circuit.

In some embodiments, there are two first regions, at least two first pins are disposed in each of the two first regions, and the two first regions are located on two opposite sides of the second region.

In this embodiment, the first pins are disposed in the two first regions, and the second pins are disposed in the second region, so that overlapping between positive and negative electrodes can be reduced, and when condensation occurs, regions in which a short circuit may occur between positive and negative electrodes are reduced, thereby reducing a risk of a short circuit between positive and negative electrodes caused by condensation. In addition, because adjacent pins of some first pins are first pins, and adjacent pins of some second pins are second pins, a safety distance can be reduced, so that the switch assembly can be designed to be simpler, and miniaturization is facilitated.

In some embodiments, there are two second regions, at least two second pins are disposed in each of the two second regions, and the two second regions are located on two opposite sides of the first region.

In this embodiment, the first pins are disposed in the first region, and the second pins are disposed in the two second regions, so that overlapping between positive and negative electrodes can be reduced, and when condensation occurs, regions in which a short circuit may occur between positive and negative electrodes are reduced, thereby reducing a risk of a short circuit between positive and negative electrodes caused by condensation. In addition, because adjacent pins of some first pins are first pins, and adjacent pins of some second pins are second pins, a safety distance can be reduced, so that the switch assembly can be designed to be simpler, and miniaturization is facilitated.

In some embodiments, the switch assembly includes a plurality of first breaking units and a plurality of second breaking units, the first breaking unit includes the first pin, the second breaking unit includes the second pin, the plurality of first breaking units are stacked in the first region in the first direction, and the plurality of second breaking units are stacked in the second region in the first direction.

In this embodiment, because the switch assembly includes a plurality of first breaking units and a plurality of second breaking units, the switch assembly may be manufactured in a modular unitized manner. This can reduce manufacturing difficulty and facilitate maintenance and replacement. The plurality of first breaking units are located in the first region, the plurality of second breaking units are located in the second region, the first breaking unit is connected to the positive input port, and the second breaking unit is connected to the negative input port. The plurality of first breaking units are a same polarity because they are all connected to the positive input ports. Therefore, when condensation occurs, no short circuit occurs even if two adjacent first breaking units are connected by condensation. Similarly, when condensation occurs, no short circuit occurs even if two adjacent second breaking units are connected by condensation. In addition, the plurality of first breaking units are stacked in the first direction, the plurality of second breaking units are stacked in the first direction, and the first direction is an arrangement direction of the first region and the second region. In this case, in the plurality of first breaking units and the plurality of second breaking units, there is a first breaking unit and a second breaking unit that are disposed adjacent to each other, and a short circuit needs to be prevented only between the first breaking unit and the second breaking unit that are adjacent to each other. This helps reduce a probability that the switch assembly in this embodiment is short-circuited.

In some embodiments, a distance, in the first direction, between two adjacent first pins is L1; a distance, in the first direction, between two adjacent second pins is L2; and a distance, in the first direction, between a first pin and a second pin that are adjacent to each other is L3, where L1<L3, and L2<L3.

In this embodiment, the distance, in the first direction, between two adjacent first pins is less than the distance, in the first direction, between the first pin and the second pin that are adjacent to each other, and the distance, in the first direction, between two adjacent first pins is less than the distance, in the first direction, between the first pin and the second pin that are adjacent to each other. In the first region and the second region in this embodiment, there are few first breaking units and second breaking units that are adjacent to each other, distances between adjacent first breaking units are L1, and similarly, distances between adjacent second breaking units are L2. Compared with a solution in which the plurality of first breaking units and the plurality of second breaking units are stacked alternately, a height, in the first direction, of the switch assembly in this embodiment can be reduced, thereby facilitating miniaturization of the switch assembly.

In some embodiments, the power converter further includes a first insulating bar disposed on the switch assembly, and in the first direction, the first insulating bar is located between the first pin and the second pin that are adjacent to each other.

In this embodiment, the first insulating bar is disposed between the first pin and the second pin that are adjacent to each other, to increase a creepage distance between the first pin and the second pin that are adjacent to each other, and reduce a probability that a short circuit occurs between the first pin and the second pin that are adjacent to each other.

In some embodiments, the power converter further includes a second circuit board, the switch assembly is soldered to the second circuit board, and the first pin and the second pin are located on a side that is of the switch assembly and that is away from the second circuit board. The power converter further includes a first insulating bar, a second insulating bar, and a third insulating bar that are disposed on the side that is of the switch assembly and that is away from the second circuit board. In the first direction, the first insulating bar is located between the first pin and the second pin that are adjacent to each other, the second insulating bar is located between two adjacent first pins, and the third insulating bar is located between two adjacent second pins. A second direction is perpendicular to the second circuit board. In the second direction, a height of the first insulating bar is greater than a height of the second insulating bar, and the height of the first insulating bar is greater than a height of the third insulating bar.

In this embodiment, the switch assembly is soldered to the second circuit board, so that cables between the switch assembly and the power device can be reduced, and neatness and aesthetics can be improved. The second insulating bar and the third insulating bar are disposed, so that a creepage distance between adjacent first pins and a creepage distance between adjacent second pins can be increased, and thicknesses, in the first direction, of the first breaking unit and the second breaking unit can be reduced, thereby effectively reducing the volume of the switch assembly. The height of the first insulating bar is greater than the height of the second insulating bar, and the height of the first insulating bar is greater than the height of the third insulating bar. In this embodiment, only one first insulating bar needs to be disposed, and the rest are the second insulating bar and the third insulating bar whose heights are less than the height of the first insulating bar. This helps reduce overall space occupied by the switch assembly and insulating bars on the switch assembly.

In some embodiments, perpendicular projections of two adjacent first pins on a reference plane are spaced from each other, and the reference plane is perpendicular to the first direction.

In this embodiment, perpendicular projections of two adjacent first pins on the reference plane are spaced from each other, so that a creepage distance between two adjacent first pins in the first direction can be increased, and a minimum distance, in the first direction, between two adjacent first pins can be reduced, thereby facilitating miniaturization of the switch assembly in this embodiment.

In some embodiments, the power converter further includes a plurality of first cables bundled together and a plurality of second cables bundled together, the plurality of first cables are electrically connected to the plurality of first pins in a one-to-one correspondence, the first cable is electrically connected between the first pin and the positive input port, the plurality of second cables are electrically connected to the plurality of second pins in a one-to-one correspondence, and the second cable is electrically connected between the second pin and the negative input port.

In this embodiment, because the plurality of first cables are bundled together, and the plurality of second cables are bundled together, overall appearance is more aesthetic. In addition, because the first pin connected to the first cable is located in the first region, and the second pin connected to the second cable is located in the second region, the first cable and the second cable are not mixed together, so that a risk of a short circuit caused by leakage of the first cable and the second cable can be prevented.

In some embodiments, the power converter further includes a plurality of positive combiner ports and a plurality of negative combiner ports, the positive combiner port is electrically connected to at least two positive input ports, each positive combiner port is electrically connected to one first cable, the negative combiner port is electrically connected to at least two negative input ports, and each negative combiner port is electrically connected to one second cable.

In this embodiment, because the positive combiner port is electrically connected to at least two positive input ports, and one positive combiner port is electrically connected to one first cable, a quantity of first cables can be effectively reduced, which facilitates arrangement and connection of the first cables, and provides neat and aesthetic appearance. Similarly, because the negative combiner port is electrically connected to at least two negative input ports, and one negative combiner port is electrically connected to one second cable, a quantity of second cables can be effectively reduced, which facilitates arrangement and connection of the second cables, and provides neat and aesthetic appearance.

In some embodiments, the power converter further includes a first circuit board, a plurality of branch current detectors, and a plurality of main circuit current detectors, the plurality of branch current detectors are integrated on the first circuit board, the plurality of positive input ports, the plurality of negative input ports, the plurality of positive combiner ports, and the plurality of negative combiner ports are all soldered to the first circuit board, the branch current detector is configured to detect an input current of the positive input port and an input current of the negative input port, and the main circuit current detector is configured to detect an outflow current of the positive combiner port and an outflow current of the negative combiner port.

In this embodiment, the first circuit board is independent of the circuit mainboard, the plurality of positive input ports and the plurality of negative input ports are integrated on the first circuit board, and the plurality of branch current detectors integrated on the first circuit board may detect current data of the positive input ports and the negative input ports. When the current data of the positive input ports and the negative input ports is known, on the first circuit board, at least two positive input ports may be electrically connected to one positive combiner port, and at least two negative input ports may be electrically connected to one negative combiner port, so that quantities of first cables and second cables can be effectively reduced. In addition, the plurality of positive input ports, the plurality of negative input ports, and the plurality of branch current detectors are disposed on the first circuit board, so that an area of the circuit mainboard can be reduced and power devices on the circuit mainboard can be reduced.

In some embodiments, the positive combiner port is electrically connected to n (n>2) positive input ports, n−1 branch current detectors detect, in a one-to-one correspondence, input currents of n−1 positive input ports that are electrically connected to the positive combiner port, and one main circuit current detector is configured to detect a total output current of the positive combiner port.

In this embodiment, the n−1 branch current detectors detect the input currents of the n−1 positive input ports in a one-to-one correspondence, and the main circuit current detector is configured to detect the total output current of the positive combiner port. In this case, a sum of the input currents of the n−1 positive input ports is subtracted from the total output current to obtain an input current of the remaining positive input port that is not detected, so that input currents of all the positive input ports and the total output current of the positive combiner port after current combining can be detected.

In some embodiments, the power generation system further includes a second circuit board, the switch assembly further includes a plurality of first insert pins and a plurality of second insert pins, the plurality of first insert pins are in a one-to-one correspondence with the plurality of first pins, the plurality of first pins are an input end of the switch assembly, the plurality of first insert pins are an output end of the switch assembly, the plurality of second insert pins are in a one-to-one correspondence with the plurality of second pins, the plurality of second pins are an input end of the switch assembly, the plurality of second insert pins are an output end of the switch assembly, the switch assembly is in insertion connection to the second circuit board by using the first insert pins and the second insert pins and is electrically connected to a trace on the second circuit board, and the second circuit board is electrically connected to the circuit mainboard through a wire.

In this embodiment, because the second circuit board is independent of the circuit mainboard, a layout position of the second circuit board is more flexible, and an installation position of the switch assembly can be set more conveniently according to a requirement. In addition, because the switch assembly is in insertion connection to the second circuit board, connecting cables between the switch assembly and the power device can be reduced. This facilitates a layout and arrangement of cables, reduces difficulty in connecting cables, and can improve aesthetics.

In some embodiments, the switch assembly further includes a plurality of first insert pins and a plurality of second insert pins, the plurality of first insert pins are in a one-to-one correspondence with the plurality of first pins, the plurality of first pins are an input end of the switch assembly, the plurality of first insert pins are an output end of the switch assembly, the plurality of second insert pins are in a one-to-one correspondence with the plurality of second pins, the plurality of second pins are an input end of the switch assembly, and the plurality of second insert pins are an output end of the switch assembly.

The switch assembly is located on the circuit mainboard, the plurality of first pins, the plurality of first insert pins, the plurality of second pins, and the plurality of second insert pins are all located on a side that is of the switch assembly and that faces the circuit mainboard, the switch assembly is in insertion connection to the circuit mainboard by using the plurality of first pins, the plurality of first insert pins, the plurality of second pins, and the plurality of second insert pins and is electrically connected to a trace on the circuit mainboard, the plurality of positive input ports and the plurality of negative input ports are electrically connected to traces on the circuit mainboard, and the plurality of first pins and the plurality of second pins are electrically connected to the plurality of positive input ports, the plurality of negative input ports, and the power device through traces on the circuit mainboard.

In this embodiment, the plurality of first pins, the plurality of first insert pins, the plurality of second pins, and the plurality of second insert pins are all inserted into the circuit mainboard and are electrically connected to traces on the circuit mainboard, the positive input port is electrically connected to the first pin through a trace on the circuit mainboard, the first insert pin is electrically connected to the power device through a trace on the circuit mainboard, the negative input port is electrically connected to the second pin through a trace on the circuit mainboard, and the second insert pin is electrically connected to the power device through a trace on the circuit mainboard. In this implementation, the cable in the foregoing embodiments may be replaced with the trace on the circuit mainboard, so that difficulty in cable routing is reduced and the entire power converter is more neat or neater.

According to a second aspect, the embodiments provide a power converter, including a housing, a circuit mainboard, a power device, an input connector, and a switch assembly. The housing includes a bottom housing and a cover plate, and the bottom housing and the cover plate enclose an accommodating cavity. The circuit mainboard is disposed in the accommodating cavity. The power device is fastened to the circuit mainboard by using a pin. The input connector includes a plurality of positive input ports and a plurality of negative input ports, and the input connector is installed on the housing and is configured to connect to an external direct current source. The switch assembly is installed on the housing, one part of the switch assembly is located inside the accommodating cavity, and the other part of the switch assembly is located outside the accommodating cavity. The switch assembly is electrically connected between the input connector and the power device. The switch assembly includes a plurality of first pins and a plurality of second pins, the plurality of first pins are located in a first region, the plurality of second pins are located in a second region, and the first region and the second region are stacked in a first direction. The first pin is electrically connected to the positive input port, the second pin is electrically connected to the negative input port, and the switch assembly is configured to control connection or disconnection between the direct current source and the power device.

In this embodiment, the plurality of first pins are distributed in a same region, and the plurality of second pins are distributed in a same region. When condensation occurs, no short circuit occurs even if two adjacent first pins are connected by condensation, and a working path of the power converter can still run normally, to avoid damage caused by a short circuit to the power converter. Similarly, the plurality of second pins are a same polarity. When condensation occurs, no short circuit occurs even if two adjacent second pins are connected by condensation. In addition, because no short circuit occurs between adjacent first pins and between adjacent second pins even if condensation occurs, reducing a creepage distance between two adjacent first pins and a creepage distance between two adjacent second pins can effectively reduce a volume of the switch assembly. In addition, because the plurality of first pins are distributed in a same region, and the plurality of second pins are distributed in a same region, a monitoring solution and a structure solution may be designed for the switch assembly in this embodiment based on a difference between a positive polarity monitoring direction and a negative polarity monitoring direction, to improve diversity of a structure design of the switch assembly.

According to a third aspect, the embodiments provide a switch assembly, including a plurality of first breaking units, a plurality of second breaking units, a connecting rod, and a knob. The first breaking unit includes a positive input pin, the second breaking unit includes a negative input pin, the plurality of first breaking units are stacked in a first region in a first direction, the plurality of second breaking units are stacked in a second region in the first direction, and the first region and the second region are stacked in the first direction. When rotating, the connecting rod can drive the plurality of first breaking units and the plurality of second breaking units to be turned on or turned off. The knob is connected to the connecting rod and is configured to drive the connecting rod to rotate.

In this embodiment, the plurality of first breaking units are configured to connect to a same polarity, the plurality of second breaking units are configured to connect to a same polarity, the plurality of first breaking units are located in the first region, the plurality of second breaking units are located in the second region, and the first region and the second region are stacked. In this way, a probability that the switch assembly in this embodiment is short-circuited can be reduced, and reducing a creepage distance between two adjacent positive input pins and a creepage distance between two adjacent negative input pins can effectively reduce a volume of the switch assembly in this embodiment.

BRIEF DESCRIPTION OF DRAWINGS

To describe solutions in embodiments or in the conventional technology more clearly, the following briefly describes accompanying drawings used for describing embodiments or the conventional technology.

DETAILED DESCRIPTION OF EMBODIMENTS

The following first explains some terms in the embodiments.

In the embodiments and accompanying drawings, the terms "first", "second", "third", "fourth", and the like are intended to distinguish between similar objects but do not necessarily indicate a specific order or sequence. It should be understood that terms used in such a way are interchangeable in proper circumstances, so that embodiments described herein can be, for example, implemented in an order other than the order illustrated or described herein. In addition, the terms "include" and "have" and any other variants mean to cover non-exclusive inclusion, for example, a process, method, system, product, or device that includes a series of steps or units is not necessarily limited to those steps or units, but may include other steps or units not expressly listed or inherent to such a process, method, product, or device.

Photovoltaic inverter: An inverter is a converter that converts a direct current into an alternating current with a fixed frequency and voltage or variable frequency and voltage. The photovoltaic inverter is an inverter that converts a variable direct current voltage generated by a solar panel (also referred to as a photovoltaic panel) into an alternating current with a mains frequency.

Parallel: "Parallel" defined herein is not limited to absolutely parallel. This definition of parallel may be understood as basically parallel, allowing a case that is not absolutely parallel caused by an assembly tolerance, a design tolerance, impact of structure flatness, and other factors.

Perpendicular: "Perpendicular" defined herein is not limited to absolutely perpendicular intersection (a 90-degree included angle) relationship, allowing a relationship that is not absolutely perpendicular intersection caused by an assembly tolerance, a design tolerance, impact of structure flatness, and other factors and allowing an error within a small angle range. For example, a relationship within an assembly error range of 80 degrees to 100 degrees may be understood as a perpendicular relationship.

PV: An abbreviation for photovoltaic, which means power generation through use of solar energy. An input port is a port connected to a photovoltaic module.

It should be noted that the accompanying drawings involved below are diagrams, and specific shapes in the accompanying drawings are not specific shapes and other shapes may be utilized, as desired.

Figure 1A:
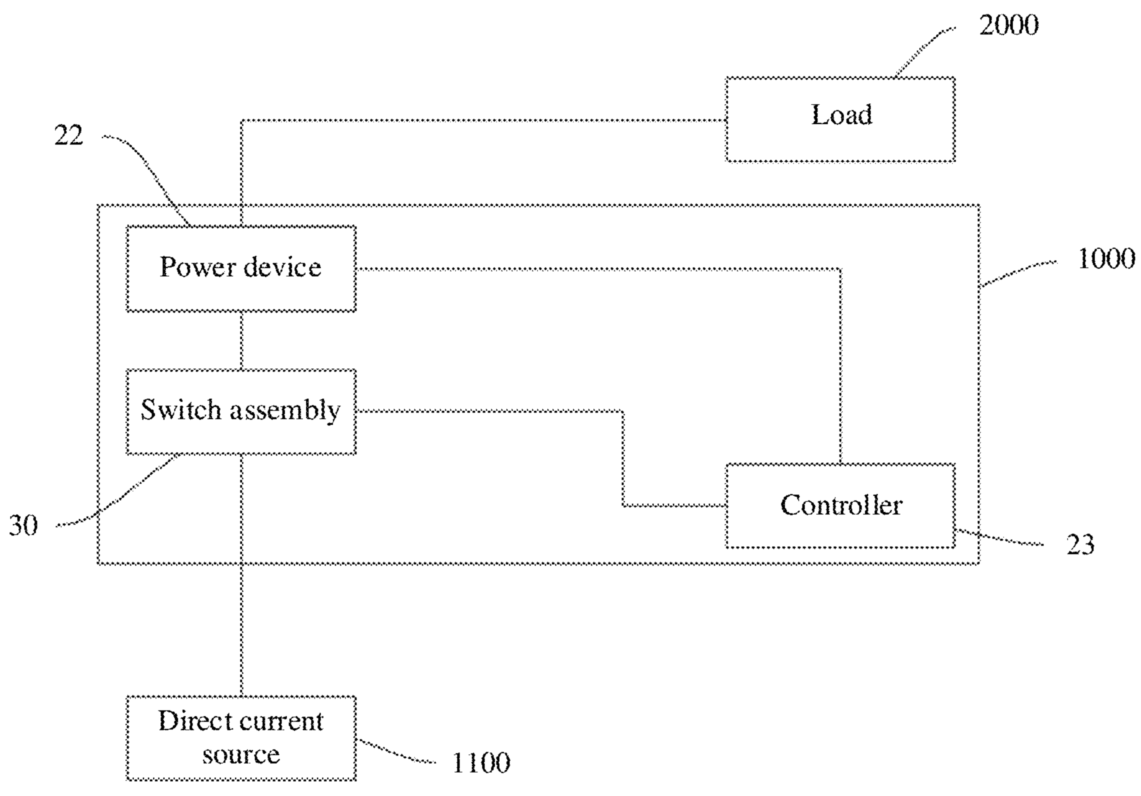
FIG. 1*a* is an application block diagram of a power generation system according to an embodiment.

FIG. 1*a* is an application block diagram of a power generation system 1000 according to an embodiment.

Refer to FIG. 1*a*. An embodiment provides a power generation system 1000. The power generation system 1000 includes a controller 23, a switch assembly 30, and a power device 22. The switch assembly 30 is electrically connected between an external direct current source 1100 and the power device 22. The controller 23 is configured to send a switch-off signal to the switch assembly 30 when the direct current source 1100 or the power device 22 is faulty. The power device 22 is configured to electrically connect to an external load 2000 and is configured to transmit electric energy to the external load 2000.

The direct current source 1100 may be a photovoltaic module, a photovoltaic string, a series-parallel circuit of a photovoltaic module and a photovoltaic string, a power supply battery in an electric vehicle, or the like. The power device 22 may include a DC/DC converter, a DC/AC converter, or the like. Both the direct current source 1100 and the power device 22 may be considered as a power supply circuit. When the power supply circuit is faulty, for example, the direct current source 1100 or the power device 22 is faulty, the controller 23 detects occurrence of the failure, and the controller 23 can send a switch-off signal to the switch assembly 30. The switch-off signal is used to trigger (that is, drive) the switch assembly 30 to be turned off, to disconnect the circuit.

The power generation system 1000 in this embodiment may be a power generation system 1000 in the field of a new energy smart microgrid (for example, a microgrid system) or a power generation system 1000 in the field of power transmission and distribution or the field of new energy (for example, a photovoltaic grid-connected system or a wind grid-connected system), or may be in the field of photovoltaic power generation (for example, a photovoltaic system 1001), the field of wind power generation (for example, a wind system), the field of a high-power converter 1200 (for example, a power generation system that converts a direct current voltage into a high-power high-voltage alternating current), or the field of an electric device (for example, a plurality of electric vehicles). This may be determined according to an actual application scenario, and is not limited herein.

The load 2000 may be a power grid or an electrical device as described below.

Figure 1B:
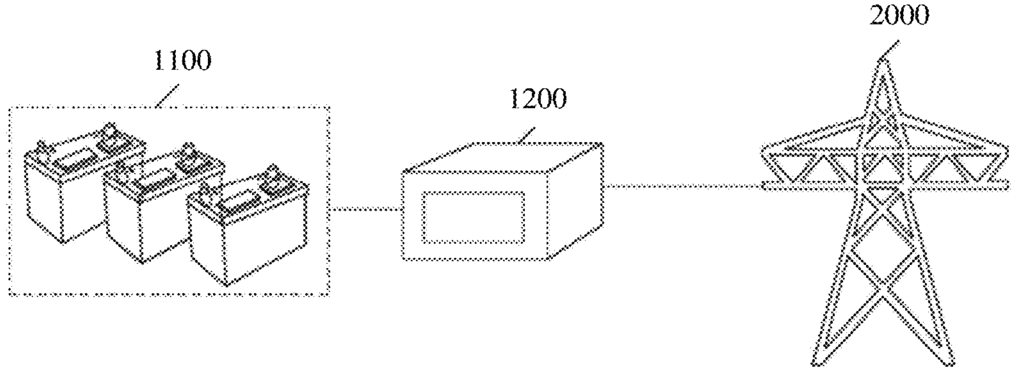
FIG. 1*b* is a diagram of a simple structure of a power generation system according to an embodiment.

FIG. 1*b* is a diagram of a simple structure of a power generation system 1000 according to an embodiment.

Refer to FIG. 1*b*. The power generation system 1000 includes a direct current source 1100 and a power converter 1200. The direct current source 1100 is electrically connected to the power converter, and outputs electric energy to a load 2000 through the power converter 1200. The power converter 1200 in this embodiment is used in the power generation system 1000.

The power converter 1200 provided in the embodiments is also applicable to a plurality of application fields such as a new energy smart microgrid, power transmission and distribution or new energy, photovoltaic power generation (for example, a photovoltaic inverter 1004), wind power generation, a high-power converter 1200, or an electric device. This may be determined according to an actual application scenario, and is not limited herein.

The power converter in this embodiment includes the power device 22, the switch assembly 30, and the controller 23 in FIG. 1*a*. For connection relationships among the power device 22, the switch assembly 30, and the controller 23, refer to FIG. 1*a*. Details are not described herein again.

It should be noted that in some implementations, the controller 23 may alternatively be independent of the power converter 1200. For example, the controller 23 is fitted to an optimizer between the direct current source 1100 and the switch assembly 30.

Figure 2:
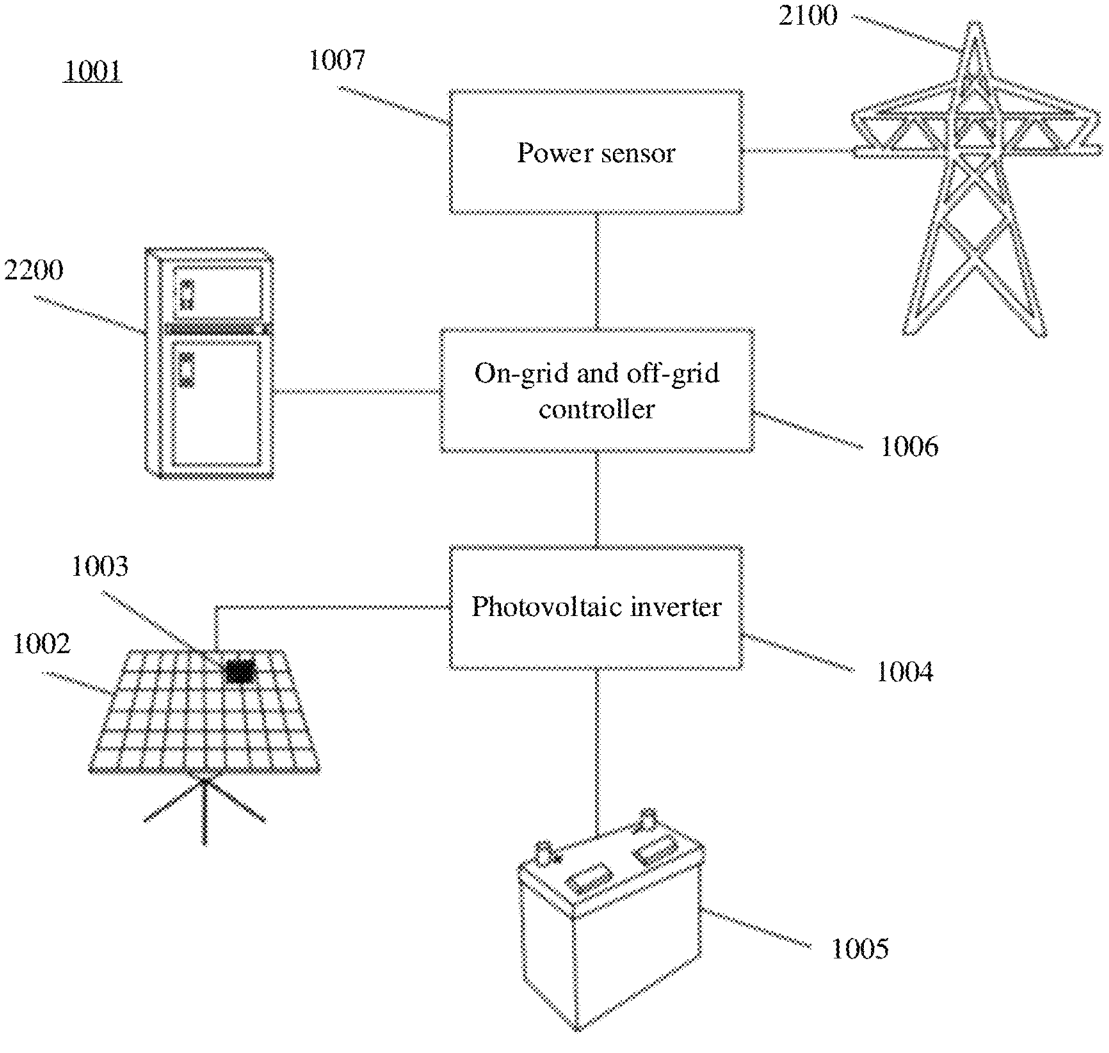
FIG. 2 is a diagram of a structure of a photovoltaic system applied to a home power station according to an embodiment.
Figure 3:
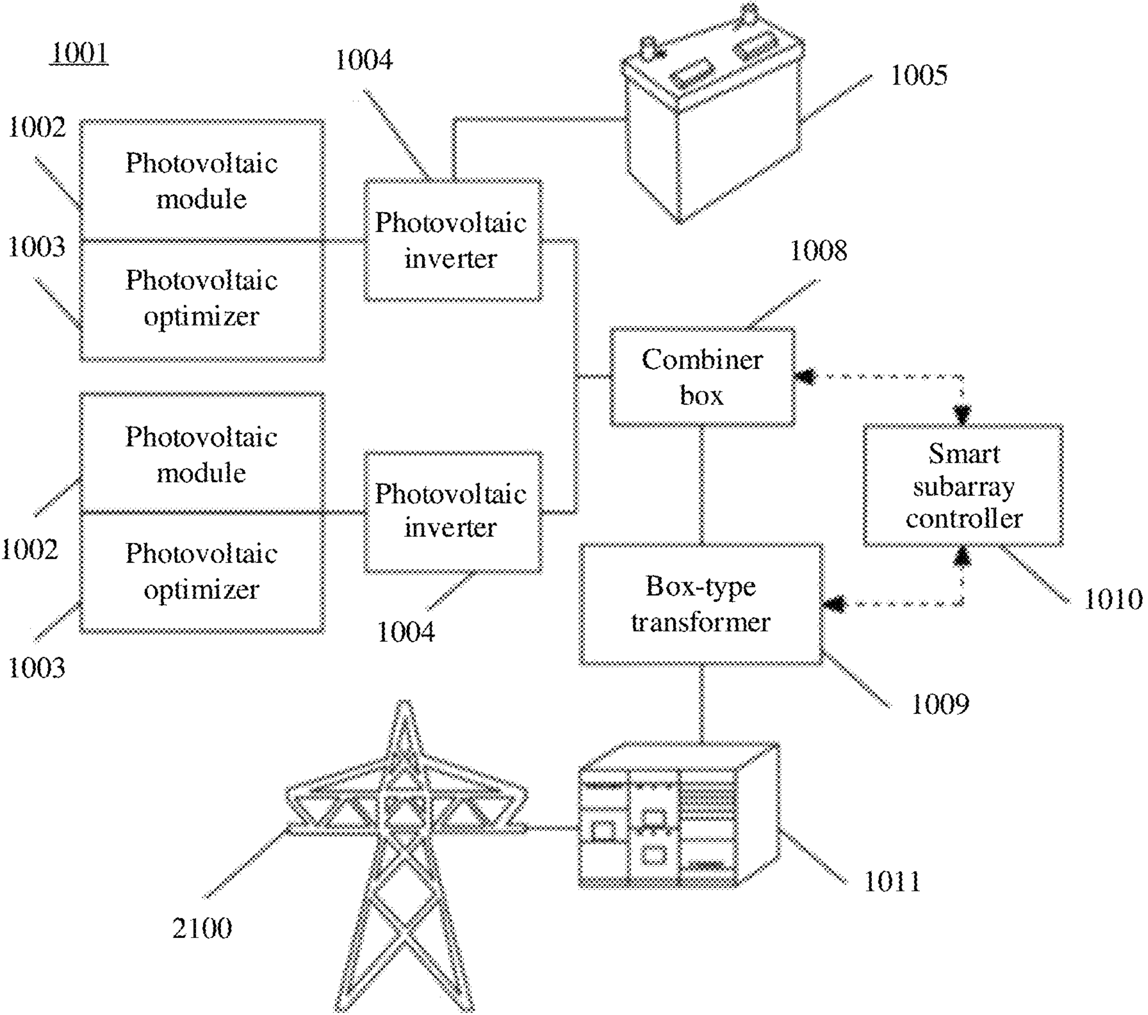
FIG. 3 is a diagram of a structure of a photovoltaic system applied to an industrial photovoltaic power station according to an embodiment.

An example in which the power generation system 1000 is a photovoltaic system 1001 and the power converter 1200 is a photovoltaic inverter 1004 is used to provide two application scenarios (as shown in FIG. 2 and FIG. 3) of the photovoltaic system 1001.

FIG. 2 is a diagram of a structure of a photovoltaic system 1001 applied to a home power station according to an embodiment.

Refer to FIG. 2. The photovoltaic system 1001 includes a photovoltaic module 1002, a photovoltaic optimizer 1003, a photovoltaic inverter 1004, an energy storage system 1005, an on-grid and off-grid controller 1006, and a power sensor 1007.

The photovoltaic optimizer 1003 is installed on the photovoltaic module 1002, and the photovoltaic module 1002 is configured to convert light energy into electric energy. The photovoltaic optimizer 1003 is configured to improve power generation efficiency of the photovoltaic module 1002. The photovoltaic optimizer 1003 is a module-level power electronic device with a direct current input and a direct current output, is connected to the photovoltaic module 1002 in series, uses a predictive current and voltage technology to ensure that the module keeps being in an optimal working state, and according to a working principle of a buck topology, is configured to resolve impact of shadow shading, inconsistent directions, or different module electrical specifications on an energy yield of a photovoltaic power station, so as to implement a maximum power output of the module and improve an energy yield of the system.

The photovoltaic module 1002 is electrically connected to the photovoltaic inverter 1004, and the photovoltaic module 1002 transmits a direct current to the photovoltaic inverter 1004. The photovoltaic inverter 1004 is electrically connected to the energy storage system 1005 and the on-grid and off-grid controller 1006.

In an implementation, the photovoltaic inverter 1004 has a direct current conversion function module. The direct current conversion function module of the photovoltaic inverter 1004 may be configured to convert a direct current generated by the photovoltaic inverter 1004 into a voltage required by the energy storage system 1005 for energy storage, and transmit the voltage to the energy storage system 1005 for energy storage.

In an implementation, the photovoltaic inverter 1004 may convert a direct current provided by the photovoltaic module 1002 into an alternating current, and transmit the alternating current to the on-grid and off-grid controller 1006. The on-grid and off-grid controller 1006 is electrically connected to an electrical device 2200, and may be electrically connected to a power grid 2100. In an actual application scenario, the on-grid and off-grid controller 1006 has an off-grid state and an on-grid state.

When the on-grid and off-grid controller 1006 is in the off-grid state, there is no electrical connection between the on-grid and off-grid controller 1006 and the power grid 2100, and the alternating current transmitted by the photovoltaic inverter 1004 is provided only for the electrical device 2200. The electrical device 2200 includes household appliances, for example, a television, a refrigerator, a washing machine, and the like.

When the on-grid and off-grid controller 1006 is in the on-grid state, the on-grid and off-grid controller 1006 is electrically connected to the power grid 2100 through the power sensor 1007. When electric energy generated by the photovoltaic module 1002 cannot satisfy an electricity-using requirement of the electrical device 2200, the power grid 2100 may supply electric energy to the photovoltaic system 1001 through the on-grid and off-grid controller 1006. When an energy yield of the photovoltaic module 1002 exceeds electricity used by the electrical device 2200, the on-grid and off-grid controller 1006 may transmit excess electricity to the power grid 2100. The power sensor 1007 is configured to measure power flow between the photovoltaic system 1001 and the power grid 2100. For example, the power sensor 1007 may be an electricity meter.

FIG. 3 is a diagram of a structure of a photovoltaic system 1001 applied to an industrial photovoltaic power station according to an embodiment.

Refer to FIG. 3. The photovoltaic system 1001 includes a photovoltaic module 1002, a photovoltaic optimizer 1003, a combiner box 1008, a photovoltaic inverter 1004, a box-type transformer 1009, an energy storage system 1005, and a smart subarray controller 1010.

The photovoltaic optimizer 1003 is installed on the photovoltaic module 1002, the photovoltaic module 1002 is configured to convert light energy into electric energy, and the photovoltaic optimizer 1003 is configured to improve power generation efficiency of the photovoltaic module 1002.

In some implementations, the photovoltaic system 1001 may include a plurality of photovoltaic modules 1002 and photovoltaic optimizers 1003. Each of the plurality of photovoltaic modules 1002 is electrically connected to one photovoltaic inverter 1004.

In an implementation, the photovoltaic inverter 1004 is connected to the energy storage system 1005 that is configured to store a direct current generated by the photovoltaic inverter 1004. In an implementation, there is a direct current combiner box 1008 (not shown in the figure) between a plurality of photovoltaic inverters 1004 and the energy storage system 1005, and the direct current combiner box 1008 is configured to combine direct currents generated by the plurality of photovoltaic inverters 1004, and then transmit the combined direct currents to the energy storage system 1005 for storage. It may be understood that a direct current conversion function module that can convert a direct current generated by the photovoltaic module 1002 into direct current energy that can be stored by the energy storage system 1005 may be disposed in the photovoltaic inverter 1004.

The combiner box 1008 shown in the figure is an alternating current combiner box 1008, and the alternating current combiner box 1008 is configured to collect and transmit alternating currents generated by the plurality of photovoltaic inverters 1004 to the box-type transformer 1009. The box-type transformer 1009 is configured to convert a voltage of the alternating current generated by the photovoltaic inverter 1004, and then transmit a converted voltage to the power grid 2100 through a power distribution room 1011. Signal transmission (as shown by a dashed line in the figure) is present between the smart subarray controller 1010 and at least one of the combiner box 1008, the box-type transformer 1009, the photovoltaic inverter 1004, and an environment monitor (not shown in the figure). The smart subarray controller 1010 is configured to control communication of the photovoltaic system 1001.

It should be noted that FIG. 2 and FIG. 3 show merely examples of application scenarios of the photovoltaic system 1001 in a home power station and an industrial photovoltaic power station, and do not represent structures and sizes of internal devices of the photovoltaic system 1001 and position relationships between the devices. A person skilled in the art may make an adjustment according to an actual requirement.

Figure 4:
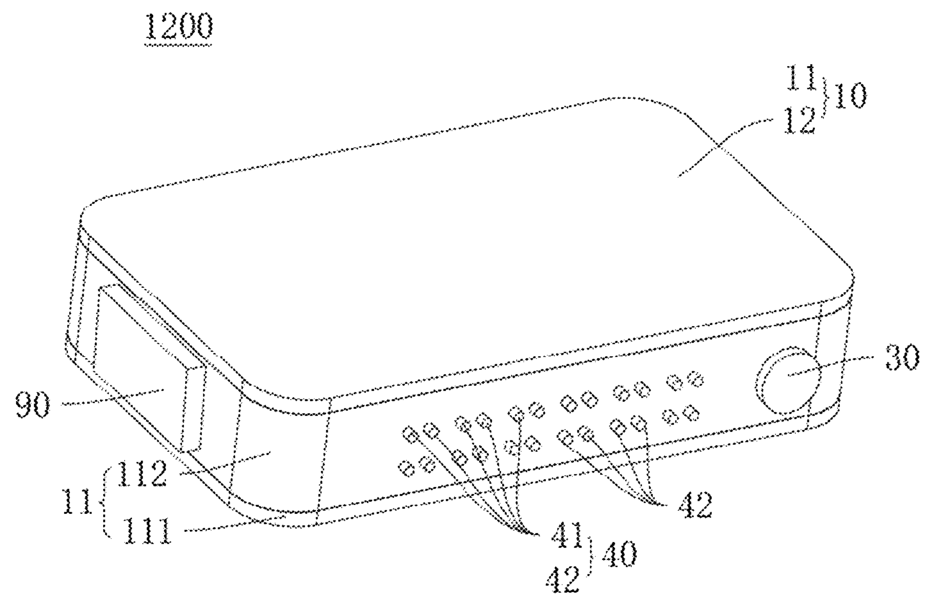
FIG. 4 is a diagram of an overall structure of a power converter according to an embodiment.
Figure 5:
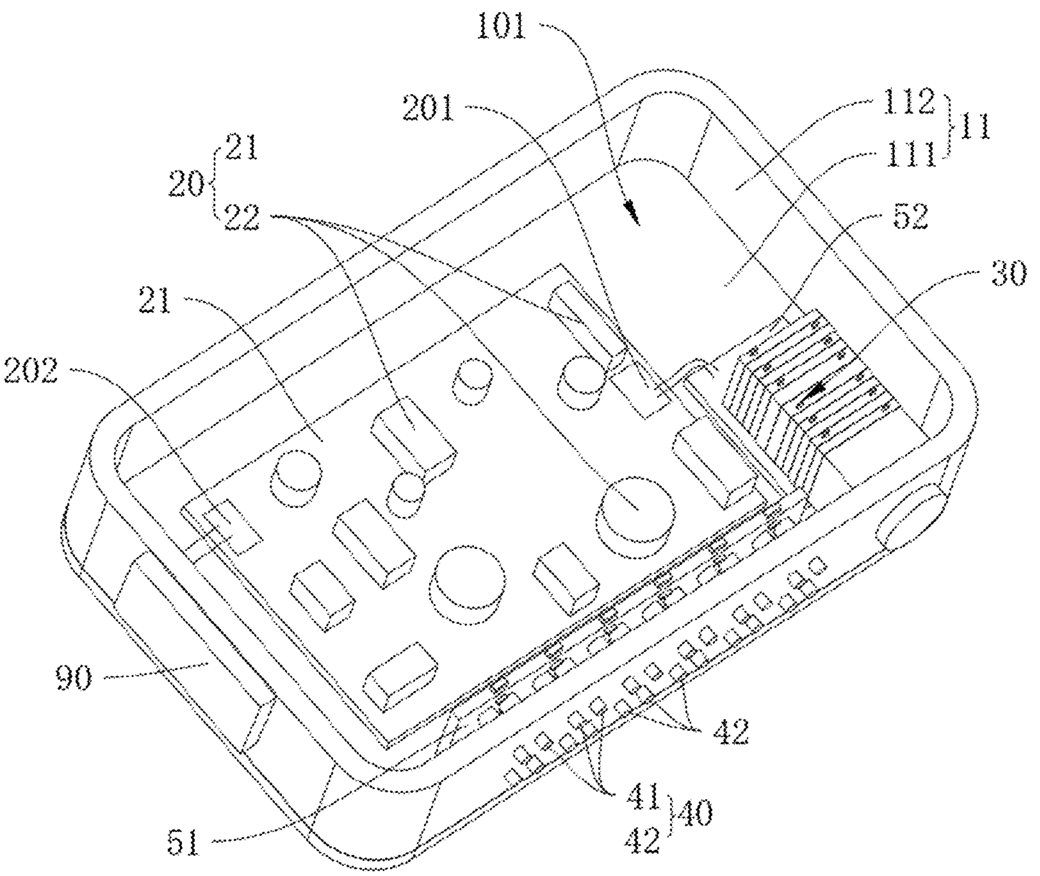
FIG. 5 is a diagram of a partial structure of the power converter in FIG. 4.

FIG. 4 is a diagram of an overall structure of a power converter 1200 according to an embodiment. FIG. 5 is a diagram of a partial structure of the power converter 1200 in FIG. 4. It may be understood that the power converter 1200 in this embodiment may be applied to the embodiments in FIG. 1*a* to FIG. 3, and may be applied to other scenarios.

Refer to FIG. 4 and FIG. 5. The power converter 1200 includes a housing 10, a functional module 20, a switch assembly 30, an input connector 40, and an output connector 90. The input connector 40 is configured to electrically connect to an external direct current source 1100 (as shown in FIG. 1*a*). The switch assembly 30 is electrically connected between the input connector 40 and the functional module 20, and is configured to control a current between the input connector 40 and the functional module 20 to be conducted or cut off. For example, an input end 201 of the functional module 20 is configured to electrically connect to the switch assembly 30, an output end 202 of the functional module 20 is electrically connected to the output connector 90, and the output connector 90 is configured to electrically connect to an external load 2000 (as shown in FIG. 1*a*). In this embodiment, a current of the external direct current source 1100 flows from the input connector 40 to the switch assembly 30, and then flows from the switch assembly 30 to the functional module 20, and a current converted by the functional module 20 is output from the output connector 90 to the external load 2000. This forms a working path of the power converter 1200, and normal working of the switch assembly 30 on the working path has important impact on use safety of the power converter 1200.

In some implementations, the input connector is a photovoltaic (PV) terminal, and is configured to electrically connect to an external photovoltaic module 1002 (as shown in FIG. 2). In this case, the input end 201 of the functional module 20 is configured to input a direct current, and the output end 202 of the functional module 20 is configured to output an alternating current.

In an implementation, as shown in FIG. 4 and FIG. 5, the housing 10 includes a bottom housing 11 and a cover plate 12, the bottom housing 11 and the cover plate 12 enclose an accommodating cavity 101, and the bottom housing 11 includes a bottom plate 111 disposed opposite to the cover plate 12 and a side plate 112 disposed around a circumference of the bottom plate 111. The accommodating cavity 101 is configured to accommodate the functional module 20, the switch assembly 30, and the like.

It may be understood that a shape of the housing 10 in this implementation is not limited, and may be a regular shape, for example, an approximately cuboid or cylindrical shape, or may be an irregular shape. This may be set according to a requirement.

In some implementations, as shown in FIG. 5, the functional module 20 includes a circuit mainboard 21 and a power device 22 integrated on the circuit mainboard 21. For example, the power device 22 may be one or more of the following: a transistor, a capacitor, an inductor coil, a diode, a rectifier bridge, a drive circuit, a control circuit, a resistor, a voltage regulator, a relay, a filter capacitor, and a processor. Also, the power device 22 may alternatively be another electronic component.

In some implementations, the switch assembly 30 is electrically connected to the input end 201 of the functional module 20 through a wire. For example, the switch assembly 30 may be electrically connected to the circuit mainboard 21 through a wire, and then electrically connected to the power device 22 on the circuit mainboard 21 through a wire integrated on the circuit mainboard 21.

It may be understood that when power devices 22 with different functions are integrated on the circuit mainboard 21, the functional module 20 can implement different functions. For example, in some implementations, after being integrated on the circuit mainboard 21, the power device 22 can convert a direct current into an alternating current. For example, the functional module 20 converts a direct current generated by the photovoltaic module 1002 into an alternating current, and then the alternating current is output to the load 2000 through the output connector 90. In some implementations, after being integrated on the circuit mainboard 21, the power device 22 can convert an alternating current into a direct current. In some implementations, after being integrated on the circuit mainboard 21, the power device 22 can change a voltage (from a high voltage to a low voltage or from a low voltage to a high voltage). It should be noted that positions of the power device 22, the input end 201 of the functional module 20, and the output end 202 of the functional module 20 in the accompanying drawings are merely examples, and do not indicate that the power device 22, the input end 201 of the functional module 20, and the output end 202 of the functional module 20 need to be disposed at the positions in the accompanying drawings.

The circuit mainboard 21 may be a printed circuit board (PCB) made of various materials, for example, a rigid PCB, a flexible PCB, a PCB made of a metal substrate, or a PCB made of a non-metal material such as ceramic.

In some implementations, as shown in FIG. 5, the circuit mainboard 21 is fastened to the bottom plate 111. It may be understood that in some other implementations, the circuit mainboard 21 may alternatively be fastened to another position on the housing 10. For example, when a requirement on performance of the circuit mainboard 21 is low, the circuit mainboard 21 may alternatively be fastened to the side plate 112 with a relatively small area, to make a layout more appropriate.

In some implementations, as shown in FIG. 5, the switch assembly 30 is configured to provide electrical isolation and safe power-off functions. The switch assembly 30 is disposed in the accommodating cavity 101, and the switch assembly 30 is electrically connected to the functional module 20 and the input connector 40, to control a current between the functional module 20 and the input connector 40 to be conducted or cut off.

In some implementations, the output connector 90 may be a connection box, and is configured to output a current converted by the functional module 20 to the external load 2000. In some implementations, the output end 202 of the functional module 20 may be electrically connected to the output connector 90 through a wire.

In some implementations, as shown in FIG. 5, the input connector 40 includes a plurality of positive input ports 41 and a plurality of negative input ports 42. The positive input port 41 is configured to connect to a positive polarity line (for example, a live wire), and the negative input port 42 is configured to connect to a negative polarity line (for example, a neutral wire). It may be understood that in some implementations, a quantity of positive input ports 41 is the same as a quantity of negative input ports 42. The plurality of positive input ports 41 and the plurality of negative input ports 42 are configured to connect to an external current input apparatus, for example, the photovoltaic module 1002 (as shown in FIG. 2). One positive input port 41 and one negative input port 42 are connected to one photovoltaic module 1002 or a group of photovoltaic modules 1002. The power converter 1200 in this embodiment includes the input connector 40, and therefore can be connected to a plurality of or a plurality of groups of photovoltaic modules 1002.

In the embodiments, a controller sends a switch-off signal to the switch assembly 30 when the external direct current source or the power device is faulty, to disconnect a circuit between the plurality of positive input ports 41 and the power device 22 or a circuit between the plurality of negative input ports 42 and the power device 22.

In the power converter 1200 in this embodiment, the plurality of positive input ports 41 and the plurality of negative input ports 42 are electrically connected to the switch assembly 30, and the switch assembly 30 is electrically connected to the functional module 20. In this case, a working principle of the power converter 1200 in this embodiment is roughly as follows: first, the plurality of positive input ports 41 and the plurality of negative input ports 42 are connected to an external current input apparatus, and a current flows from the plurality of positive input ports 41 and the plurality of negative input ports 42 to the switch assembly 30, and then flows to the functional module 20 through the switch assembly 30. Then, the functional module 20 acts on the input current to perform required power conversion, for example, conversion from a direct current into an alternating current, or conversion from a high voltage into a low voltage, and then outputs a current obtained after the power conversion to the outside, for example, directly outputs the current to an electrical device 2200 (as shown in FIG. 2) or a power grid 2100 (as shown in FIG. 2), or may output the current to an energy storage system 1005 (as shown in FIG. 2).

It may be understood that the power converter 1200 in this embodiment may include other components in addition to the foregoing components. For example, a heat dissipation fin (not shown in the figure) may be disposed on an outer side of the housing 10. For another example, a communication module (not shown in the figure) may be disposed in the housing 10 to perform remote management.

In some implementations, as shown in FIG. 5, the power converter 1200 further includes a first circuit board 51. The first circuit board 51 is independent of the circuit mainboard 21, and the plurality of positive input ports 41 and the plurality of negative input ports 42 are all soldered to the first circuit board 51. In this implementation, because the first circuit board 51 is independent of the circuit mainboard 21, a layout position of the first circuit board 51 is more flexible, so that it is possible to solder the plurality of positive input ports 41 and the plurality of negative input ports 42 to the first circuit board 51. Because the plurality of positive input ports 41 and the plurality of negative input ports 42 are soldered to the first circuit board 51, cables configured to connect the plurality of positive input ports 41 and the plurality of negative input ports 42 to the functional module 20 can be reduced. This facilitates a layout and arrangement of cables, reduces difficulty in connecting cables, and can improve aesthetics. More importantly, there is no short circuit between cables caused by cable pulling due to too many cables during cable connection, so that safety performance is improved.

It may be understood that the first circuit board 51 may be disposed at a position according to a requirement, and a specific position is not limited. For example, in some implementations, the plurality of positive input ports 41 and the plurality of negative input ports 42 are disposed on one side wall of the side plate 112, and the first circuit board 51 is disposed parallel to the side wall, to reduce difficulty in soldering the plurality of positive input ports 41 and the plurality of negative input ports 42 to the first circuit board 51 and improve soldering stability. In some implementations, the first circuit board 51 and the circuit mainboard 21 are disposed perpendicular to each other, so that space of the accommodating cavity 101 can be effectively reduced, thereby facilitating miniaturization of the power converter 1200.

The first circuit board 51 may be a PCB made of various materials, for example, a rigid PCB, a flexible PCB, a PCB made of a metal substrate, or a PCB made of a non-metal material such as ceramic.

It may be understood that in some other implementations, the plurality of positive input ports 41 and the plurality of negative input ports 42 may alternatively be connected to the circuit mainboard 21 through cables.

In some implementations, as shown in FIG. 5, the power converter 1200 further includes a second circuit board 52. The second circuit board 52 is independent of the circuit mainboard 21 and the first circuit board 51. The switch assembly 30 is located on the second circuit board 52 and is electrically connected to a trace on the second circuit board 52. In some implementations, the switch assembly 30 may be in insertion connection to the second circuit board 52 by using an insert pin. In this implementation, because the second circuit board 52 is independent of the circuit mainboard 21, a layout position of the second circuit board 52 is more flexible, and an installation position of the switch assembly 30 can be set more conveniently according to a requirement. In addition, because the switch assembly 30 is in insertion connection to the second circuit board 52, connecting cables between the switch assembly 30 and the functional module 20 can be reduced. This facilitates a layout and arrangement of cables, reduces difficulty in connecting cables, and can improve aesthetics.

In some implementations, the switch assembly 30 may alternatively be soldered to the second circuit board 52.

It may be understood that the second circuit board 52 may be disposed at a position according to a requirement, and a specific position is not limited. For example, in some implementations, both the second circuit board 52 and the first circuit board 51 are disposed on the bottom plate 111 of the housing 10. In some implementations, the second circuit board 52 may be disposed on the side plate 112 and perpendicular to the first circuit board 51. This is not limited in the embodiments.

The second circuit board 52 may be a PCB made of various materials, for example, a rigid PCB, a flexible PCB, a PCB made of a metal substrate, or a PCB made of a non-metal material such as ceramic.

It may be understood that in some other implementations, the switch assembly 30 may alternatively be directly connected to the circuit mainboard 21, or the switch assembly 30 is electrically connected to the circuit mainboard 21 through a cable.

Figure 6:
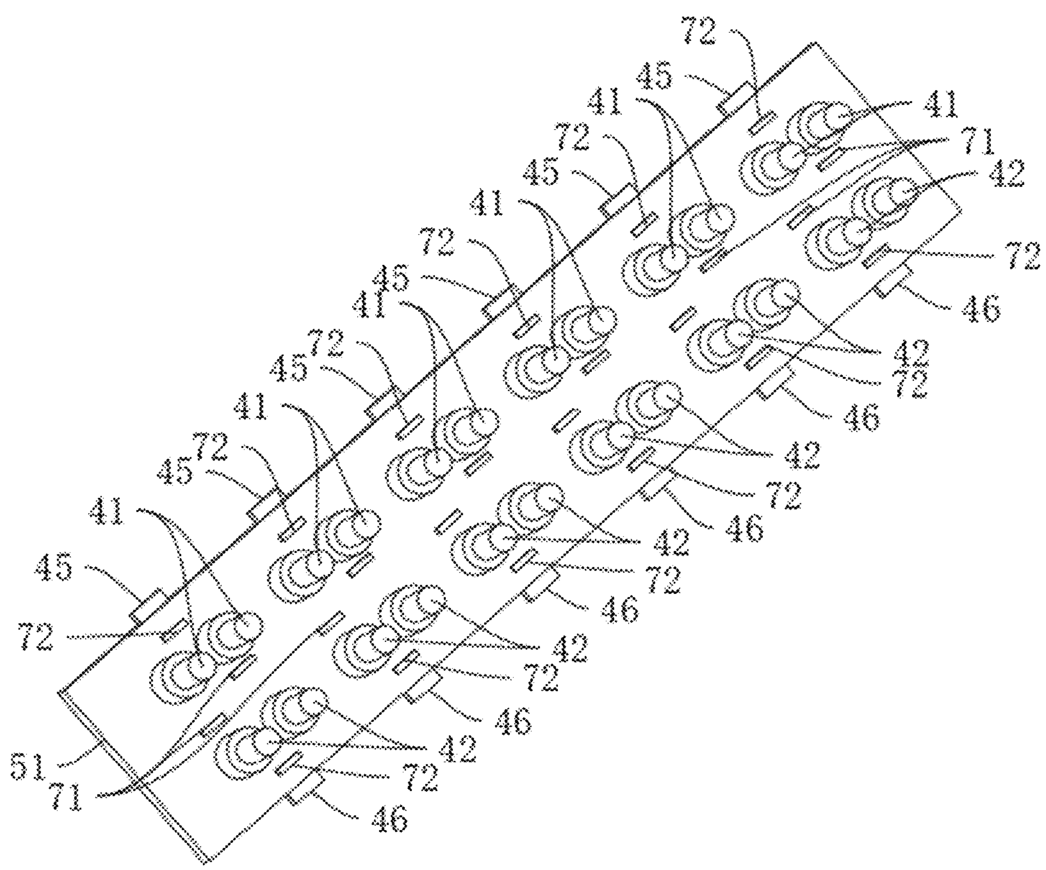
FIG. 6 is a diagram of a structure of a first circuit board in FIG. 4 and components connected to the first circuit board.
Figure 7A:
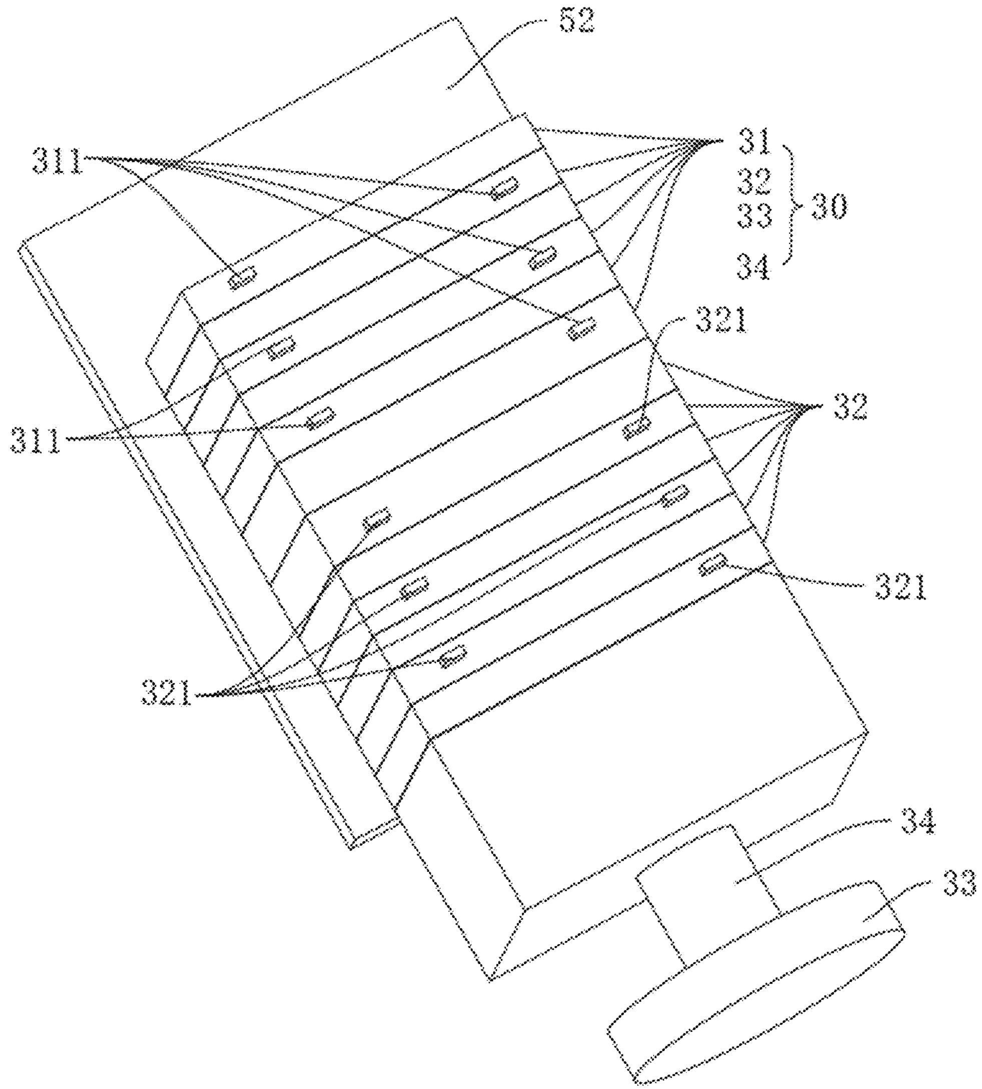
FIG. 7*a* is a diagram of a structure of a second circuit board in FIG. 4 and a switch assembly located on the second circuit board.
Figure 7B:
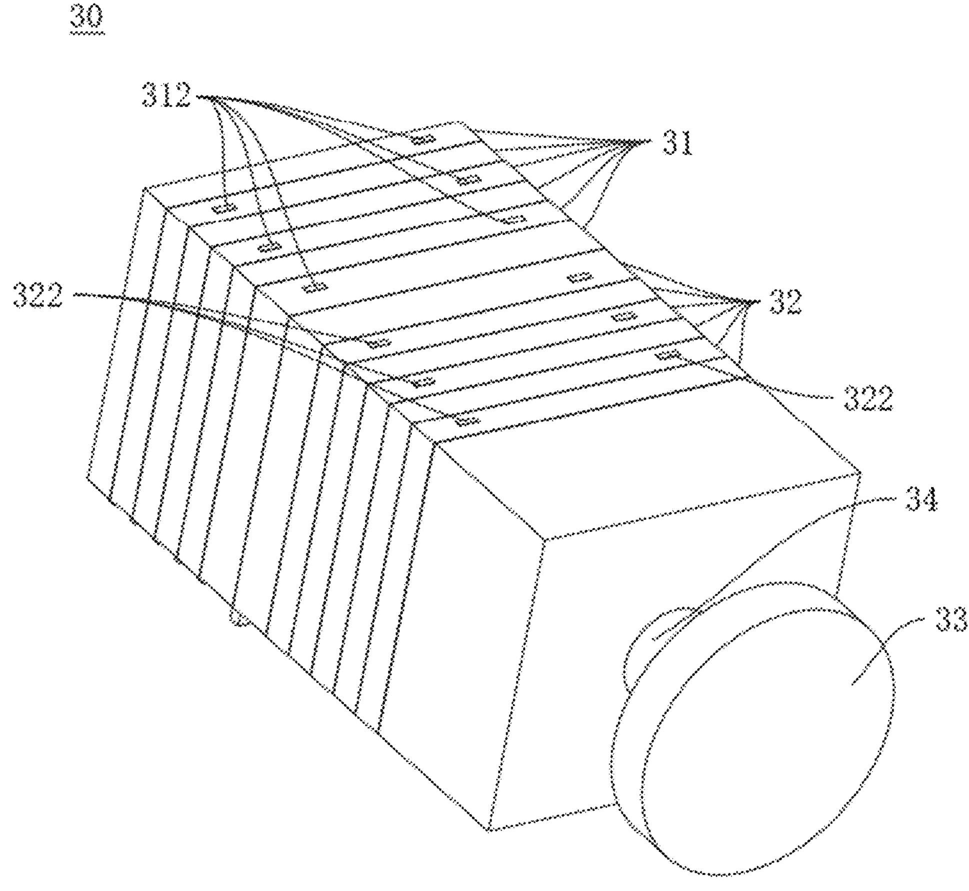
FIG. 7*b* is a diagram of a structure of a second circuit board in FIG. 4 and a switch assembly located on the second circuit board from another perspective.
Figure 7C:
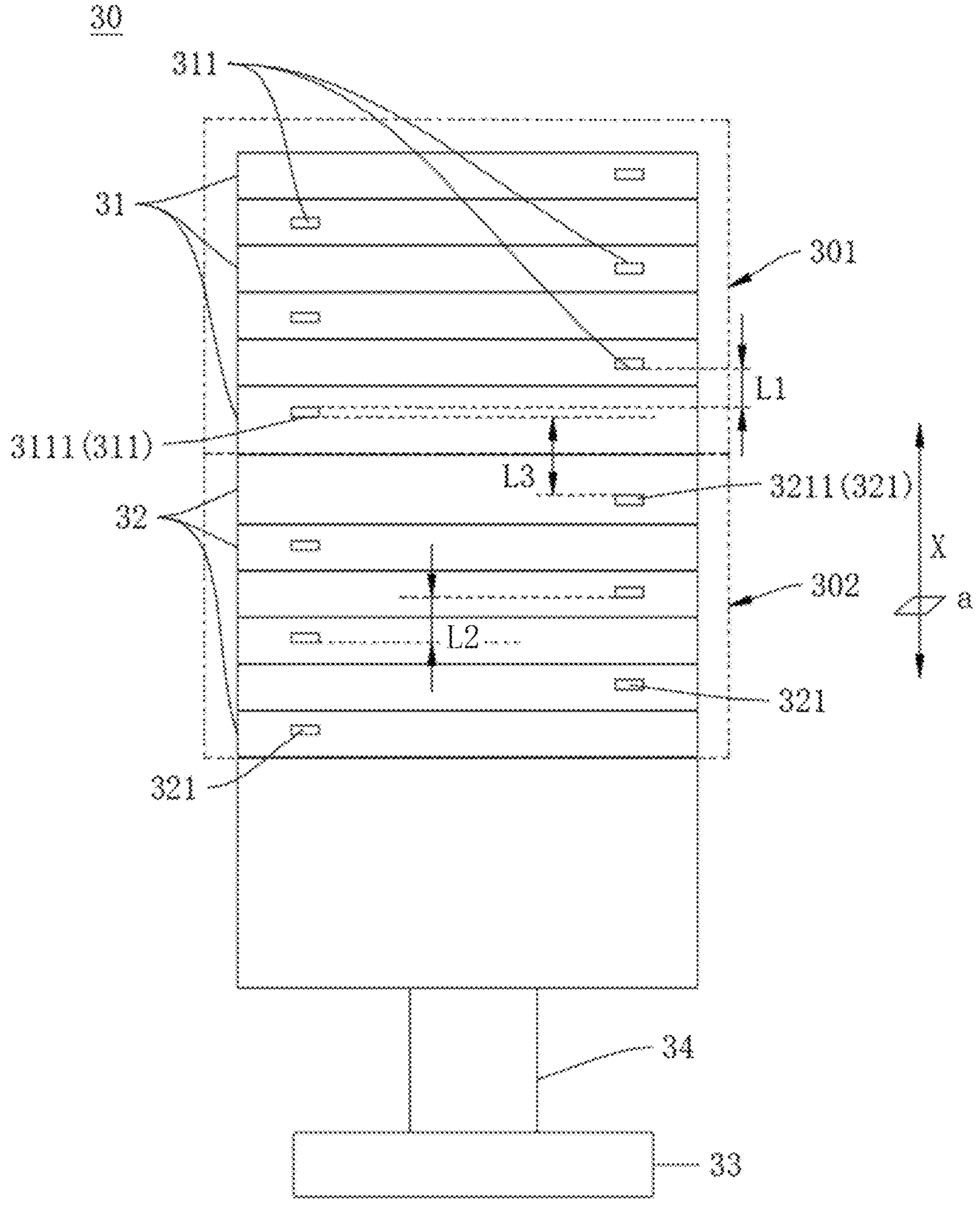
FIG. 7*c* is a diagram of a structure of a second circuit board in FIG. 4 and a switch assembly located on the second circuit board from still another perspective.
Figure 8:
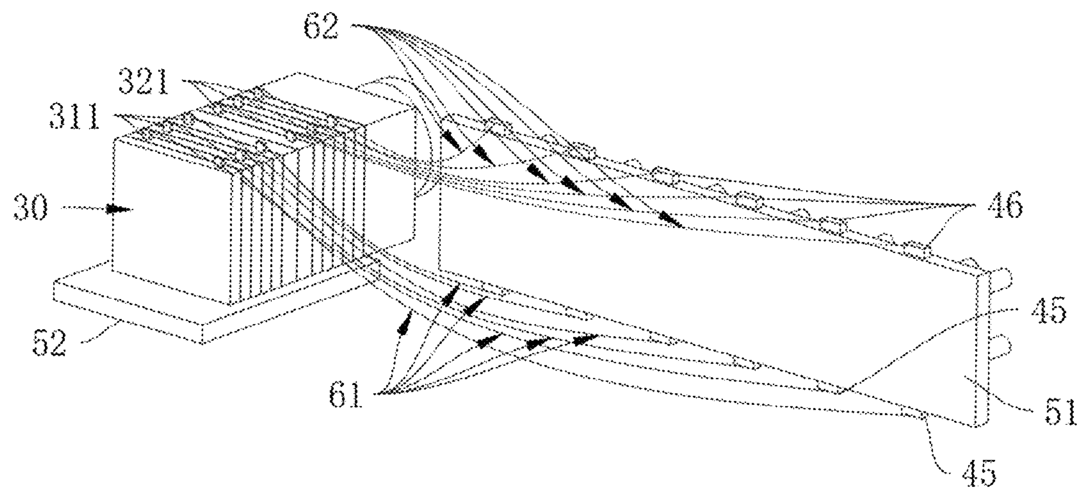
FIG. 8 is a diagram of a structure of an input connector and a switch assembly in FIG. 4 that are connected to each other through a cable.

FIG. 6 is a diagram of a structure of the first circuit board 51 in FIG. 4 and components connected to the first circuit board 51. FIG. 7*a* is a diagram of a structure of the second circuit board 52 in FIG. 4 and the switch assembly 30 located on the second circuit board 52. FIG. 7*b* is a diagram of a structure of the second circuit board 52 in FIG. 4 and the switch assembly 30 located on the second circuit board 52 from another perspective. FIG. 7*c* is a diagram of a structure of the second circuit board 52 in FIG. 4 and the switch assembly 30 located on the second circuit board 52 from still another perspective. FIG. 8 is a diagram of a structure of the input connector 40 and the switch assembly 30 in FIG. 4 that are connected to each other through a cable.

Refer to FIG. 6. The plurality of positive input ports 41 are arranged in a row and soldered to the first circuit board 51, and the plurality of negative input ports 42 are arranged in a row and soldered to the first circuit board 51. An arrangement direction of the plurality of positive input ports 41 is parallel to an arrangement direction of the plurality of negative input ports 42. Such a design facilitates connection for a user during use and is less prone to errors, facilitates cable routing and makes it less likely that a positive polarity cable and a negative polarity cable are mixed together to cause a short circuit, and can improve appearance aesthetics.

Refer to FIG. 7*a*. The switch assembly 30 includes a plurality of first pins 311 and a plurality of second pins 321. The first pin 311 is configured to electrically connect to the positive input port 41, and the second pin 321 is configured to electrically connect to the negative input port 42.

Refer to FIG. 8. The power converter 1200 further includes a first cable 61 and a second cable 62. For quantities of first cables 61 and second cables 62, refer to quantities of first pins 311 and second pins 321. For example, in some implementations, the quantity of first cables 61 is the same as the quantity of first pins 311, and the quantity of second cables 62 is the same as the quantity of second pins 321. The first cable 61 is configured to electrically connect the positive input port 41 to the first pin 311, and the second cable 62 is configured to electrically connect the negative input port 42 to the second pin 321.

It may be understood that in some implementations, the quantity of first cables 61 is the same as a quantity of positive input ports 41, and the quantity of second cables 62 is the same as a quantity of negative input ports 42. In some implementations, the quantity of positive input ports 41 is greater than the quantity of first cables 61. For example, the quantity of positive input ports 41 is n times ($n \geq 2$) of the quantity of first cables 61. The quantity of negative input ports 42 is greater than the quantity of second cables 62. For example, the quantity of negative input ports 42 is n times ($n \geq 2$) of the quantity of second cables 62. Further, in some other implementations, the quantities of first cables 61 and second cables 62 may be set according to another requirement.

Refer to FIG. 6 to FIG. 8. In some implementations, the power converter 1200 further includes a plurality of positive combiner ports 45 and a plurality of negative combiner ports 46. The positive combiner port 45 is electrically connected to at least two positive input ports 41, and each positive combiner port 45 is electrically connected to one first cable 61. The negative combiner port 46 is electrically connected to at least two negative input ports 42, and each negative combiner port 46 is electrically connected to one second cable 62. Because the positive combiner port 45 is electrically connected to at least two positive input ports 41, and one positive combiner port 45 is electrically connected to one first cable 61, compared with a solution in which the positive input port 41 is directly connected to the first pin 311 through a cable, this implementation can effectively reduce the quantity of first cables 61, facilitate arrangement and connection of the first cables 61, and provide neat and aesthetic appearance. Similarly, because the negative combiner port 46 is electrically connected to at least two negative input ports 42, and one negative combiner port 46 is electrically connected to one second cable 62, the quantity of second cables 62 can be effectively reduced, which facilitates arrangement and connection of the second cables 62, and provides neat and aesthetic appearance.

For example, in a solution in which no independent first circuit board 51 is disposed, different photovoltaic modules 1002 (as shown in FIG. 2) are connected to the input connector 40, and input currents through the input connector 40. The currents input by the photovoltaic modules 1002 flow to the functional module 20 after flowing through the switch assembly 30, and are combined in the functional module 20. In this case, each input connector 40 needs to be connected to one cable. In this implementation, the first circuit board 51 independent of the circuit mainboard 21 is added to connect to the input connector 40, so that with performance support of the first circuit board 51, a step of combining currents may be performed before the currents flow through the switch assembly 30, that is, current combining is implemented on the first circuit board 51. For example, combining of a plurality of currents is implemented by using the positive combiner port 45 and the negative combiner port 46, so that the quantities of first cables 61 and second cables 62 can be effectively reduced.

In some implementations, metal traces (not shown in the figure) are formed on the first circuit board 51, and the positive combiner port 45 is electrically connected, through the metal trace, to positive input ports 41 that need current combining. Similarly, the negative combiner port 46 may be electrically connected, through the metal trace formed on the first circuit board 51, to negative input ports 42 that need current combining.

In some implementations, as shown in FIG. 6 and FIG. 8, every two positive input ports 41 are electrically connected to one positive combiner port 45, and correspondingly, every two negative input ports 42 are electrically connected to one negative combiner port 46. As shown in FIG. 6, 12 positive input ports 41 are combined into six channels by using six positive combiner ports 45, and 12 negative input ports 42 are combined into six channels by using six negative combiner ports 46, so that the quantity of first cables 61 and the quantity of second cables 62 can be effectively reduced by half.

It may be understood that in some implementations, one positive combiner port 45 may be electrically connected to three, four, or another quantity of positive input ports 41. Correspondingly, one negative combiner port 46 may be electrically connected to three, four, or another quantity of negative input ports 42.

In some implementations, as shown in FIG. 6 and FIG. 8, the plurality of positive combiner ports 45 are arranged in a row, the plurality of negative combiner ports 46 are arranged in a row, and an arrangement direction of the plurality of positive combiner ports 45 is consistent with an arrangement direction of the plurality of negative combiner ports 46. In this way, in this implementation, the first cables 61 connected to the positive combiner ports 45 can be conveniently bundled together, and the second cables 62 connected to the negative combiner ports 46 can be conveniently bundled together, so that the first cable 61 with a positive polarity and the second cable 62 with a negative polarity are not mixed together, to avoid a short circuit.

It may be understood that, the foregoing manner is merely one arrangement manner of the plurality of positive combiner ports 45 and the plurality of negative combiner ports 46. The plurality of positive combiner ports 45 and the plurality of negative combiner ports 46 may alternatively be arranged in another manner.

In some implementations, as shown in FIG. 6, the power converter 1200 further includes a plurality of branch current detectors 71 and a plurality of main circuit current detectors 72. The branch current detector 71 is configured to detect a current flowing into the input connector 40, and the main circuit current detector 72 is configured to detect a current that is obtained after combining and that flows out of the positive combiner port 45 and a current that is obtained after combining and that flows out of the negative combiner port 46.

Quantities of branch current detectors 71 and main circuit current detectors 72 may be set according to a requirement. For example, in some implementations, as shown in FIG. 6, when there are 12 positive input ports 41, 12 negative input ports 42, six positive combiner ports 45, and six negative combiner ports 46, current detection may be implemented by using six main circuit current detectors 72 and six branch current detectors 71. For example, the six main circuit current detectors 72 detect the six positive combiner ports 45 in a one-to-one correspondence, and the six branch current detectors 71 are configured to detect six of the 12 positive input ports 41. For example, the six positive input ports 41 each are one of a pair of positive input ports 41 whose currents are combined together, and are detected by using the six branch current detectors 71 in a one-to-one correspondence. In this case, because a current of one of each pair of positive input ports 41 whose currents are combined together can be detected, and a current after combining can be obtained by detecting the positive combiner port 45, values of currents of the 12 positive input ports 41 and the six positive combiner ports 45 can be obtained.

For example, the quantities of branch current detectors 71 and main circuit current detectors 72 may be set with reference to the following manner. The positive combiner port 45 is electrically connected to n ($n \geq 2$) positive input ports 41, $n-1$ branch current detectors 71 detect, in a one-to-one correspondence, input currents of $n-1$ positive input ports 41 that are electrically connected to the positive combiner port 45, and one main circuit current detector 72 is configured to detect a total output current of the positive combiner port 45. The $n-1$ branch current detectors 71 detect the input currents of the $n-1$ positive input ports 41 in a one-to-one correspondence, and the main circuit current detector 72 is configured to detect the total output current of the positive combiner port 45. In this case, a sum of the input currents of the $n-1$ positive input ports 41 is subtracted from the total output current to obtain an input current of the remaining positive input port 41 that is not detected, so that input currents of all the positive input ports 41 and the total output current of the positive combiner port 45 after current combining can be detected.

In some implementations, as shown in FIG. 6, the plurality of branch current detectors 71 and the plurality of main circuit current detectors 72 are integrated on the first circuit board 51, so that space of the circuit mainboard 21 can be reduced. In addition, the plurality of branch current detectors 71 and the plurality of main circuit current detectors 72 are integrated on the first circuit board 51, so that a current of the input connector 40, a current of the positive combiner port 45, and a current of the negative combiner port 46 can be detected before the current flows through the switch assembly 30, to have linkage with the switch assembly 30. For example, when a current value exceeds a preset value, the switch assembly 30 is turned off. Because a current is monitored before the current flows through the switch assembly 30, a probability that a current that exceeds a preset value flows from the switch assembly 30 to the circuit mainboard 21 can be reduced, and time for reaction of the switch assembly 30 is increased to some extent, to effectively reduce damage to the functional module 20. In addition, the first circuit board 51 is independent of the circuit mainboard 21, the plurality of positive input ports 41 and the plurality of negative input ports 42 are integrated on the first circuit board 51, and the plurality of branch current detectors 71 integrated on the first circuit board 51 may detect current data of the positive input ports 41 and the negative input ports 42. When the current data of the positive input ports 41 and the negative input ports 42 is known, on the first circuit board 51, at least two positive input ports 41 may be electrically connected to one positive combiner port 45, and at least two negative input ports 42 may be electrically connected to one negative combiner port 46, so that the quantities of first cables 61 and second cables 62 can be effectively reduced. In addition, the plurality of positive input ports 41, the plurality of negative input ports 42, and the plurality of branch current detectors 71 are disposed on the first circuit board 51, so that an area of the circuit mainboard 21 can be reduced and power devices 22 on the circuit mainboard 21 can be reduced.

It may be understood that in some other implementations, the main circuit current detector 72 may alternatively be disposed on the circuit mainboard 21.

It may be understood that in some other implementations, currents of the negative combiner port 46 and the negative input port 42 may be detected by using the main circuit current detector 72 and the branch current detector 71. For a specific detection manner, refer to the detection of currents of the positive combiner port 45 and the positive input port 41 described above. Details are not described herein again.

In some implementations, as shown in FIG. 7*a* and FIG. 7*c*, the plurality of first pins 311 are located in a first region 301, the plurality of second pins 321 are located in a second region 302, and the first region 301 and the second region 302 are stacked in a first direction X. It should be noted that the first region 301 and the second region 302 in this implementation are two regions that are independent of each other, and do not have overlapping parts. The plurality of first pins 311 are distributed in a same region, and the plurality of second pins 321 are distributed in a same region. When condensation occurs, no short circuit occurs even if two adjacent first pins 311 are connected by condensation, and a working path of the power converter 1200 can still run normally, to avoid damage caused by a short circuit to the power converter 1200. Similarly, the plurality of second pins 321 are a same polarity. When condensation occurs, no short circuit occurs even if two adjacent second pins 321 are connected by condensation. In addition, because no short circuit occurs between adjacent first pins 311 and between adjacent second pins 321 even if condensation occurs, reducing a creepage distance between two adjacent first pins 311 and a creepage distance between two adjacent second pins 321 can effectively reduce a volume of the switch assembly 30. In addition, because the plurality of first pins 311 are distributed in a same region, and the plurality of second pins 321 are distributed in a same region, a monitoring solution and a structure solution may be designed for the switch assembly 30 in this embodiment based on a difference between a positive polarity monitoring direction and a negative polarity monitoring direction, to improve diversity of a structure design of the switch assembly 30.

It may be understood that the first region 301 and the second region 302 in this implementation may be contiguous to each other, or may be spaced apart from each other by a specific distance.

In some implementations, as shown in FIG. 7*a* and FIG. 7*b*, the switch assembly 30 includes a plurality of first breaking units 31 and a plurality of second breaking units 32.

The first breaking unit 31 includes the first pin 311 described above, and the first breaking unit 31 further includes a first insert pin 312. For the first breaking unit 31, the first pin 311 is used for current inflow, and the first insert pin 312 is used for current outflow. For example, the first insert pin 312 is inserted into the second circuit board 52, so that the first insert pin 312 is electrically connected to a trace on the second circuit board 52. It may be understood that in some other implementations, the first insert pin 312 may alternatively be soldered to the circuit mainboard 21 (as shown in FIG. 4), or may be electrically connected to the second circuit board 52 or the circuit mainboard 21 through a wire.

For the first breaking unit 31, when the first pin 311 is directly or indirectly electrically connected to the first insert pin 312, the first breaking unit 31 is turned on, and when electrical connection between the first pin 311 and the first insert pin 312 is broken, the first breaking unit 31 is turned off.

Similarly, the second breaking unit 32 includes the second pin 321 described above, and the second breaking unit 32 further includes a second insert pin 322. For the second breaking unit 32, the second pin 321 is used for current inflow, and the second insert pin 322 is used for current outflow. For example, the second insert pin 322 is inserted into the second circuit board 52, so that the second insert pin 322 is electrically connected to a trace on the second circuit board 52. It may be understood that in some other implementations, the second insert pin 322 may alternatively be soldered to the circuit mainboard 21, or may be electrically connected to the second circuit board 52 or the circuit mainboard 21 through a wire.

For the second breaking unit 32, when the second pin 321 is directly or indirectly electrically connected to the second insert pin 322, the second breaking unit 32 is turned on, and when electrical connection between the second pin 321 and the second insert pin 322 is broken, the second breaking unit 32 is turned off.

It may be understood that, because the plurality of first pins 311 are located in the first region 301, and the first pin 311 and the first insert pin 312 belong to the first breaking unit 31, a plurality of first insert pins 312 are also located in the first region 301. Similarly, because the plurality of second pins 321 are located in the second region 302, and the second pin 321 and the second insert pin 322 belong to the second breaking unit 32, a plurality of second insert pins 322 are also located in the second region 302.

Each first breaking unit 31 may control a current of one first cable 61 (as shown in FIG. 8) to be conducted or cut off. Similarly, each second breaking unit 32 may control a current of one second cable 62 (as shown in FIG. 8) to be conducted or cut off.

In some implementations, as shown in FIG. 7*a* to FIG. 7*c*, the plurality of first breaking units 31 are stacked in the first region 301 in the first direction X, and the plurality of second breaking units 32 are stacked in the second region 302 in the first direction X. Because the switch assembly 30 includes a plurality of first breaking units 31 and a plurality of second breaking units 32, the switch assembly 30 may be manufactured in a modular unitized manner. This can reduce manufacturing difficulty and facilitate maintenance and replacement. The plurality of first breaking units 31 are located in the first region 301, the plurality of second breaking units 32 are located in the second region 302, the first breaking unit 31 is electrically connected to the positive input port 41 through the first pin 311 and is electrically connected to the power device through the first insert pin 312, the second breaking unit 32 is connected to the negative input port 42 through the second pin 321 and is electrically connected to the power device through the second insert pin 322, and the plurality of first breaking units 31 are a same polarity. Therefore, when condensation occurs, no short circuit occurs even if first pins 311 of two adjacent first breaking units 31 are connected by condensation, and/or first insert pins 312 of two adjacent first breaking units 31 are connected by condensation; and no short circuit occurs even if second pins 321 of two adjacent second breaking units 32 are connected by condensation, and/or second insert pins 322 of two adjacent second breaking units 32 are connected by condensation.

It should be noted that, that two adjacent first breaking units 31 are connected by condensation includes that first pins 311 on the two adjacent first breaking units 31 are connected by condensation, and further includes that all other current-flowing structures included in the first breaking units 31, for example, first insert pins 312 on the two adjacent first breaking units 31, are connected by condensation. Similarly, that two adjacent second breaking units 32 are connected by condensation includes that second pins 321 on the two adjacent second breaking units 32 are connected by condensation, and further includes that all other current-flowing structures included in the second breaking units 32, for example, second insert pins 322 on the two adjacent second breaking units 32, are connected by condensation.

In addition, the plurality of first breaking units 31 are stacked in the first direction X, the plurality of second breaking units 32 are stacked in the first direction X, and the first direction X is an arrangement direction of the first region 301 and the second region 302. In this case, a short circuit needs to be prevented only between an outermost first breaking unit 31 contiguous to the second region in the plurality of first breaking units 31 and a second breaking unit 32 adjacent to the first breaking unit 31. Compared with a solution in which the plurality of first breaking units 31 and the plurality of second breaking units 32 are stacked alternately in the first direction X, in this implementation, there are fewer first breaking units 31 and second breaking units 32 for which short circuits need to be prevented, so that a probability that the switch assembly 30 is short-circuited can be reduced, and it is convenient to protect the first breaking units 31 and the second breaking units 32.

In addition, because a large creepage distance is not required for preventing a short circuit between the plurality of first breaking units 31 in the first region 301, and a large creepage distance is not required for preventing a short circuit between the plurality of second breaking units 32 in the second region 302, distances between the first breaking units 31 and between the second breaking units 32 can be effectively reduced, so that the volume of the switch assembly 30 can be effectively reduced.

In some implementations, as shown in FIG. 7*a* and FIG. 7*c*, a distance, in the first direction X, between two adjacent first pins 311 is L1, a distance, in the first direction X, between two adjacent second pins 321 is L2, and a distance, in the first direction X, between a first pin 311 and a second pin 321 that are adjacent to each other is L3, where L1<L3, and L2<L3. The distance, in the first direction X, between two adjacent first pins 311 is less than the distance, in the first direction X, between the first pin 311 and the second pin 321 that are adjacent to each other, and the distance, in the first direction X, between two adjacent second pins 321 is less than the distance, in the first direction X, between the first pin 311 and the second pin 321 that are adjacent to each other. In the first region 301 and the second region 302 in this embodiment, there are few first breaking units 31 and second breaking units 32 that are adjacent to each other, distances between adjacent first breaking units 31 are L1, and similarly, distances between adjacent second breaking units 32 are L2. Compared with a solution in which the plurality of first breaking units 31 and the plurality of second breaking units 32 are stacked alternately, a height, in the first direction X, of the switch assembly 30 in this embodiment can be reduced, thereby facilitating miniaturization of the switch assembly 30.

It may be understood that L1, L2, and L3 in this implementation may represent specific values, and may represent value ranges. For example, in some implementations, L1 is 4 mm to 10 mm, L2 is 4 mm to 10 mm, and L3 is 20 mm to 40 mm. Further, in some other implementations, values of L1, L2, and L3 may vary based on a size and a type of the switch assembly 30.

In some implementations, as shown in FIG. 7*a* and FIG. 7*c*, a first pin 311 closest to the second region 302 in the first region 301 is a pin 1 3111, a second pin 321 closest to the first region 301 in the second region 302 is a pin 2 3211, and the pin 1 3111 and the pin 2 3211 are disposed in a staggered manner in the first direction X. "Disposed in a staggered manner" may be understood as follows: in the first direction X, the pin 1 3111 and the pin 2 3211 are staggered and not arranged in a column. It may also be understood as follows: perpendicular projections of the pin 1 3111 and the pin 2 3211 on a reference plane a are spaced from each other, and the reference plane a is perpendicular to the first direction X. A short circuit is most likely to occur between the first pin 311 closest to the second region 302 in the first region 301 and the second pin 321 closest to the first region 301 in the second region 302. In this implementation, the perpendicular projections of the first pin 311 closest to the second region 302 in the first region 301 and the second pin 321 closest to the first region 301 in the second region 302 on the reference plane a are spaced from each other, so that a creepage distance between the first pin 311 closest to the second region 302 in the first region 301 and the second pin 321 closest to the first region 301 in the second region 302 can be increased, to effectively prevent a short circuit.

In some implementations, as shown in FIG. 7*a* and FIG. 7*c*, perpendicular projections of two adjacent first pins 311 on the reference plane a are spaced from each other, and the reference plane a is perpendicular to the first direction X. Perpendicular projections of two adjacent first pins 311 on the reference plane a are spaced from each other, so that a creepage distance between two adjacent first pins 311 in the first direction X can be increased, and a distance, in the first direction X, between two adjacent first pins 311 can be reduced, thereby facilitating miniaturization of the switch assembly 30 in this embodiment.

In some implementations, as shown in FIG. 7*a* and FIG. 7*c*, perpendicular projections of two adjacent second pins 321 on the reference plane a are spaced from each other, and the reference plane a is perpendicular to the first direction X. Perpendicular projections of two adjacent second pins 321 on the reference plane a are spaced from each other, so that a creepage distance between two adjacent second pins 321 in the first direction X can be increased, and a distance, in the first direction X, between two adjacent second pins 321 can be reduced, thereby facilitating miniaturization of the switch assembly 30 in this embodiment.

In some implementations, as shown in FIG. 7*a* and FIG. 7*b*, the switch assembly 30 further includes a knob 33 and a connecting rod 34. When rotating, the connecting rod 34 can drive the plurality of first breaking units 31 and the plurality of second breaking units 32 to be turned on or turned off. For example, when rotating to a specific position, the connecting rod 34 can drive the first pin 311 to be electrically connected to the first insert pin 312, and drive the second pin 321 to be electrically connected to the second insert pin 322. In this case, the first breaking unit 31 is turned on, and the second breaking unit 32 is turned on. When rotating to another position, the connecting rod 34 can drive electrical connection between the first pin 311 and the first insert pin 312 to be broken, and drive electrical connection between the second pin 321 and the second insert pin 322 to be broken.

The knob 33 is connected to the connecting rod 34 and is configured to drive the connecting rod 34 to rotate. In some implementations, the knob 33 is located outside the housing 10, and the connecting rod 34 passes through the housing 10 to be connected to the knob 33. In this way, a user can conveniently change an on state or an off state of the first breaking unit 31 and the second breaking unit 32 by rotating the knob 33. This facilitates an operation of the user.

Refer to FIG. 4 to FIG. 8. A working principle of the power converter 1200 in embodiments is as follows: first, the input connector 40 is connected to a current input device, for example, a photovoltaic module 1002 (as shown in FIG. 2), and currents flow to the first breaking unit 31 in the first region 301 through the first cable 61 and flow to the second breaking unit 32 in the second region 302 through the second cable 62, and then flow to the functional module 20 through the first breaking unit 31 and the second breaking unit 32. Then, the functional module 20 performs power conversion on the currents. In this process, if a short circuit or an unstable current occurs, the first breaking unit 31 and the second breaking unit 32 may be turned off in time, to prevent the power converter 1200 from being damaged.

Figure 9A:
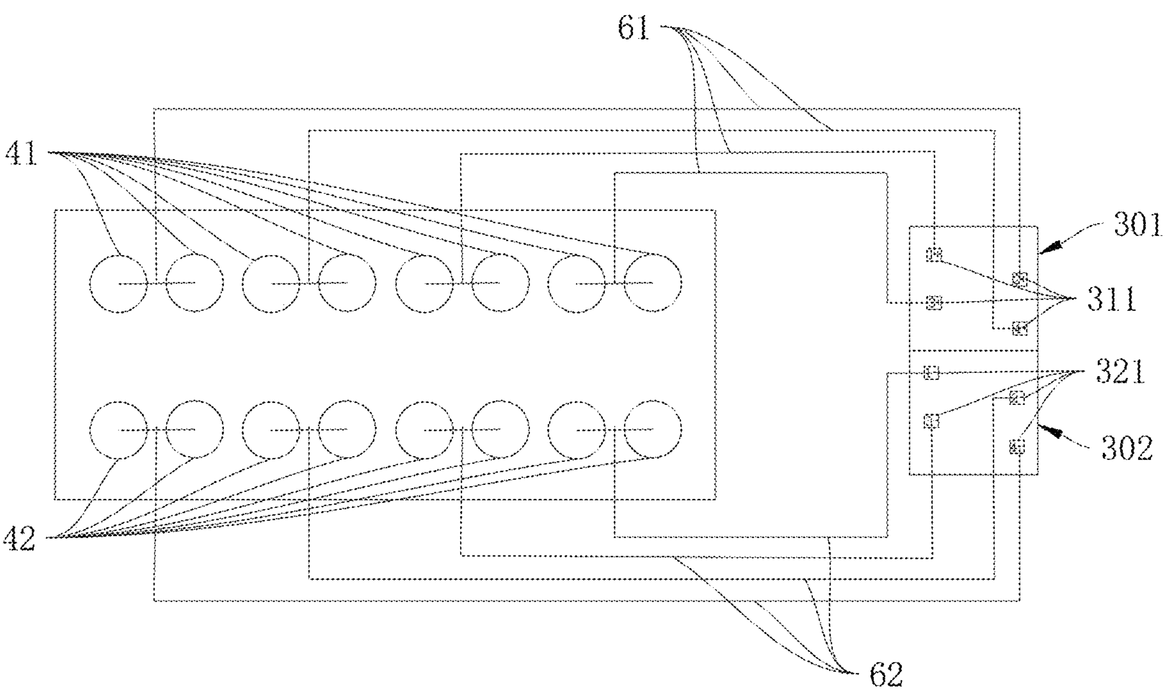
FIG. 9*a* is a diagram of a connection structure of an input connector and a switch assembly of the power converter in FIG. 4.
Figure 9B:
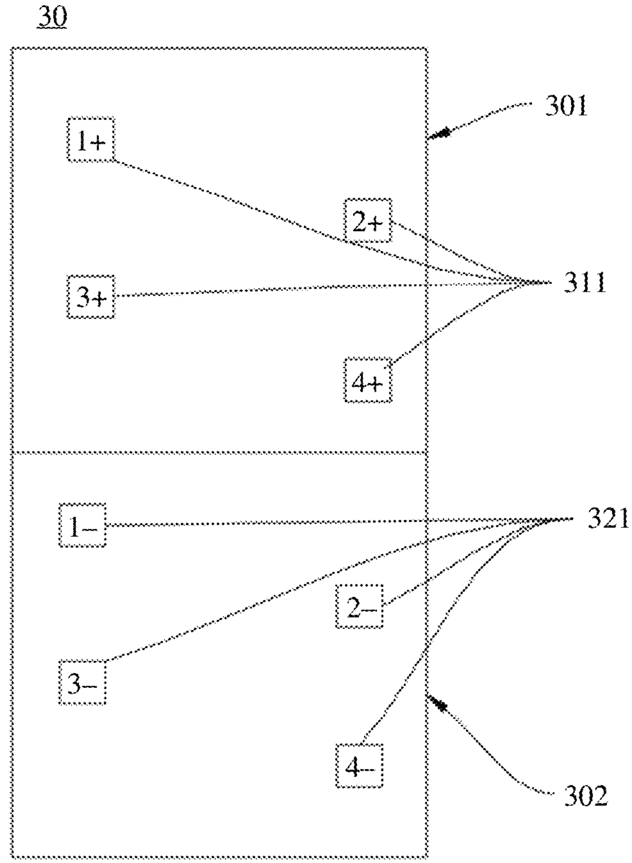
FIG. 9*b* is a diagram of a structure of the switch assembly in FIG. 9*a;*

FIG. 9*a* is a diagram of a connection structure of the input connector 40 and the switch assembly 30 of the power converter 1200 in FIG. 4. FIG. 9*b* is a diagram of a structure of the switch assembly 30 in FIG. 9*a*.

Refer to FIG. 6 to FIG. 9*b*. There is one first region 301 and one second region 302, and the first region 301 and the second region 302 are contiguous to each other. In an example in which there are eight pairs of input connectors 40, four first pins 311 are spaced from each other in the first region 301 in the first direction X, and four second pins 321 are spaced from each other in the second region 302 in the first direction X. After current combining, two positive input ports 41 are electrically connected to one first pin 311 through the first cable 61, and after current combining, two negative input ports 42 are electrically connected to one second pin 321 through the second cable 62. In this embodiment, there is one first region 301 and one second region 302, the four first pins 311 are spaced from each other in the first direction X, and the four second pins 321 are spaced from each other in the first direction X. In this case, only one first pin 311 in the four first pins 311 is adjacent to a second pin 321 in the four second pins 321, the remaining three first pins 311 are adjacent to each other, so that a short circuit risk can be avoided, and the remaining three second pins 321 are adjacent to each other, so that a short circuit risk can be avoided. Therefore, a short circuit prevention setting needs to be made only for the first pin 311 and the second pin 321 that are adjacent to each other, to effectively reduce a short circuit risk for the switch assembly 30 in this embodiment.

In some implementations, the plurality of positive input ports 41 are located on a same side, and the plurality of negative input ports 42 are located on a same side. In addition, the first pins 311 are all located in the first region 301, and the second pins 321 are all located in the second region 302, so that a plurality of first cables 61 can be conveniently bundled together, to improve neatness and aesthetics. Similarly, a plurality of second cables 62 may be conveniently bundled together, to improve neatness and aesthetics.

A number identifier is set at each first pin 311 in the first region 301, for example, 1+, 2+, 3+, and 4+ in the first region 301 in FIG. 9*b*. A number identifier is set at each second pin 321 in the second region 302, for example, 1−, 2−, 3−, and 4− in the second region 302 in FIG. 9*b*. It may be understood that the number identifier may be replaced with another identifier, for example, a letter identifier, a shape identifier, or the like.

Figure 10A:
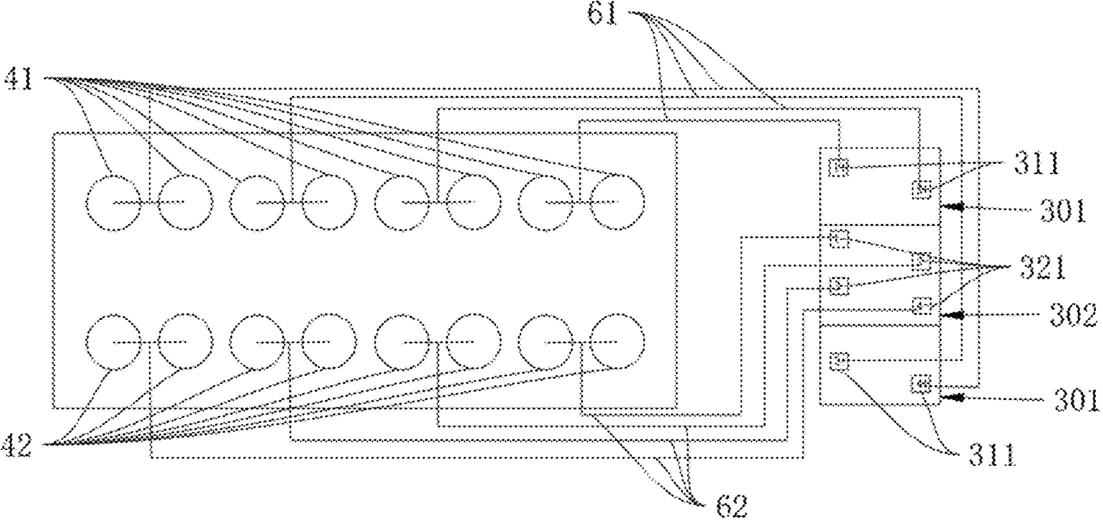
FIG. 10*a* is a diagram of a connection structure of an input connector and a switch assembly of another power converter according to an embodiment.
Figure 10B:
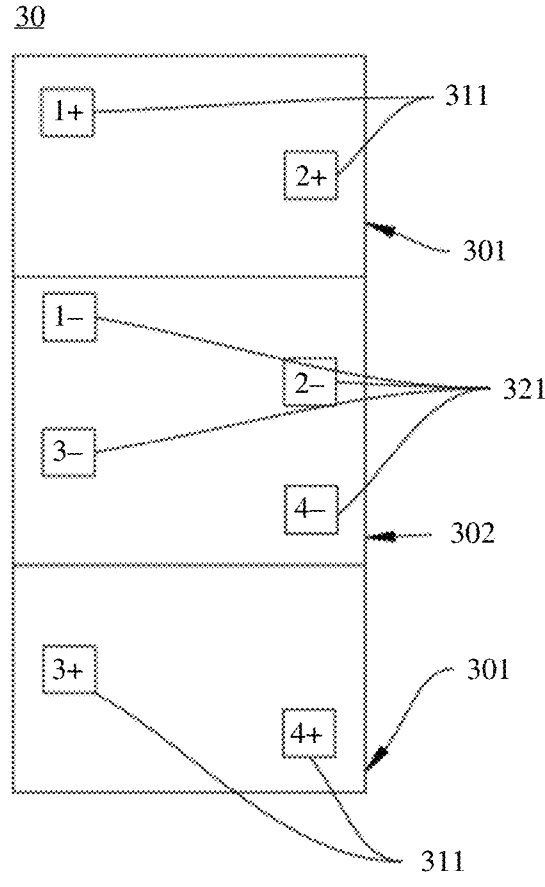
FIG. 10*b* is a diagram of a structure of the switch assembly in FIG. 10*a;*

FIG. 10*a* is a diagram of a connection structure of an input connector 40 and a switch assembly 30 of another power converter 1200 according to an embodiment. FIG. 10*b* is a diagram of a structure of the switch assembly 30 in FIG. 10*a*.

Refer to FIG. 6 to FIG. 8, FIG. 10*a*, and FIG. 10*b*. There are two first regions 301 and one second region 302, the two first regions 301 and the second region 302 are stacked in the first direction X, and the second region 302 is located between the two first regions 301. In an example in which there are eight pairs of input connectors 40, two first pins 311 are spaced from each other in each of the two first regions 301 in the first direction X, and four second pins 321 are spaced from each other in the second region 302 in the first direction X. After current combining, two positive input ports 41 are electrically connected to one first pin 311 through the first cable 61, and after current combining, two negative input ports 42 are electrically connected to one second pin 321 through the second cable 62. In this embodiment, the first pins 311 connected to positive input ports 41 are all located in the first regions 301, and the second pins 321 connected to negative input ports 42 are all located in the second region 302, so that overlapping between positive and negative electrodes can be reduced, and when condensation occurs, regions in which a short circuit may occur between positive and negative electrodes are reduced, thereby reducing a risk of a short circuit between positive and negative electrodes caused by condensation. In addition, because adjacent pins of some first pins 311 are first pins 311, and adjacent pins of some second pins 321 are second pins 321, a safety distance can be reduced, so that the switch assembly 30 can be designed to be simpler, and miniaturization is facilitated.

A number identifier is set at each first pin 311 in the first regions 301, for example, 1+, 2+, 3+, and 4+ in the first regions 301 in FIG. 10*b*. A number identifier is set at each second pin 321 in the second region 302, for example, 1−, 2−, 3−, and 4− in the second region 302 in FIG. 10*b*. It may be understood that the number identifier may be replaced with another identifier, for example, a letter identifier, a shape identifier, or the like.

In some implementations, two first pins 311 (1+ and 2+) and two first pins 311 (3+ and 4+) are respectively located in the two first regions 301, and four second pins 321 (1−, 2−, 3−, and 4−) are disposed in the second region 302 between the two first regions 301. The two second pins 321 (1− and 2−) are close to the two first pins 311 (1+ and 2+), and the two second pins 321 (3− and 4−) are close to the two first pins 311 (3+ and 4+). This facilitates corresponding matching of the plurality of first pins 311 and the second pins 321. Further, an arrangement manner of the plurality of first pins 311 and the plurality of second pins 321 is not limited to the foregoing one. In some other implementations, the two first pins 311 (1+ and 4+) may be in one first region 301 and the two first pins 311 (2+ and 3+) may be in the other first region 301, or the two second pins 321 (3− and 4−) may be close to the two first pins 311 (1+ and 2+).

Figure 11A:
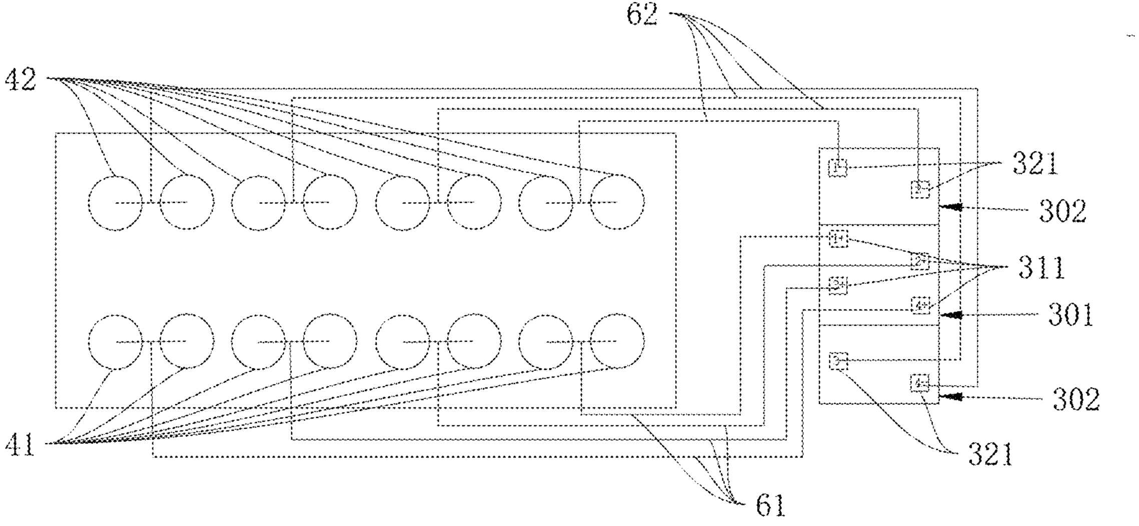
FIG. 11*a* is a diagram of a connection structure of an input connector and a switch assembly of still another power converter according to an embodiment.
Figure 11B:
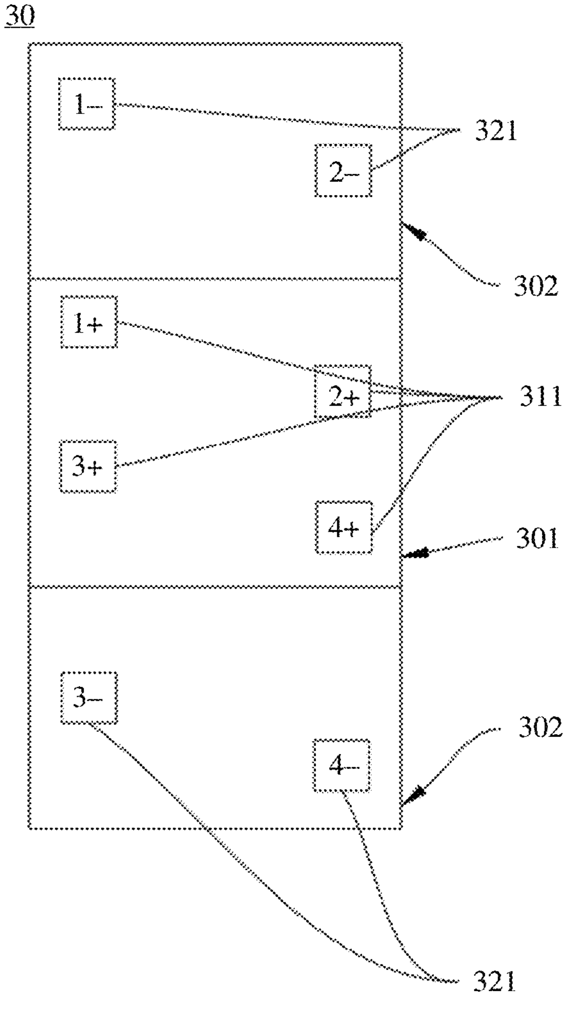
FIG. 11*b* is a diagram of a structure of the switch assembly in FIG. 11*a;*

FIG. 11*a* is a diagram of a connection structure of an input connector 40 and a switch assembly 30 of still another power converter 1200 according to an embodiment. FIG. 11*b* is a diagram of a structure of the switch assembly 30 in FIG. 11*a*.

Refer to FIG. 6 to FIG. 8, FIG. 11*a*, and FIG. 11*b*. There are two second regions 302 and one first region 301, the two second regions 302 and the first region 301 are stacked in the first direction X, and the first region 301 is located between the two second regions 302. In an example in which there are eight pairs of input connectors 40, two second pins 321 are spaced from each other in each of the two second regions 302 in the first direction X, and four first pins 311 are spaced from each other in the first region 301 in the first direction X. After current combining, two positive input ports 41 are electrically connected to one first pin 311 through the first cable 61, and after current combining, two negative input ports 42 are electrically connected to one second pin 321 through the second cable 62. In this embodiment, the first pins 311 connected to positive input ports 41 are all located in the first region 301, and the second pins 321 connected to negative input ports 42 are all located in the second regions 302, so that overlapping between positive and negative electrodes can be reduced, and when condensation occurs, regions in which a short circuit may occur between positive and negative electrodes are reduced, thereby reducing a risk of a short circuit between positive and negative electrodes caused by condensation. In addition, because adjacent pins of some first pins 311 are first pins 311, and adjacent pins of some second pins 321 are second pins 321, a safety distance can be reduced, so that the switch assembly 30 can be designed to be simpler, and miniaturization is facilitated.

It may be understood that in some other implementations, there are at least two first regions 301 and at least two second regions 302, the first regions 301 and the second regions 302 are stacked alternately, at least two first pins 311 are disposed in each first region 301, and at least two second pins 321 are disposed in each second region 302.

A number identifier is set at each first pin 311 in the first region 301, for example, 1+, 2+, 3+, and 4+ in the first region 301 in FIG. 11*b*. A number identifier is set at each second pin 321 in the second regions 302, for example, 1−, 2−, 3−, and 4− in the second regions 302 in FIG. 11*b*. It may be understood that the number identifier may be replaced with another identifier, for example, a letter identifier, a shape identifier, or the like.

In some implementations, two second pins 321 (1− and 2−) and two second pins 321 (3− and 4−) are respectively located in the two second regions 302, and four first pins 311 (1+, 2+, 3+, and 4+) are disposed in the first region 301 between the two second regions 302. The two first pins 311 (1+ and 2+) are close to the two second pins 321 (1− and 2−), and the two first pins 311 (3+ and 4+) are close to the two second pins 321 (3− and 4−). This facilitates corresponding matching of the plurality of first pins 311 and the second pins 321. Further, an arrangement manner of the plurality of first pins 311 and the plurality of second pins 321 is not limited to the foregoing one. In some other implementations, the two second pins 321 (1− and 4−) may be in one second region 302 and the two second pins 321 (2− and 3−) may be in the other second region 302, or the two first pins 311 (3+ and 4+) may be close to the two second pins 321 (1− and 2−).

Figure 12:
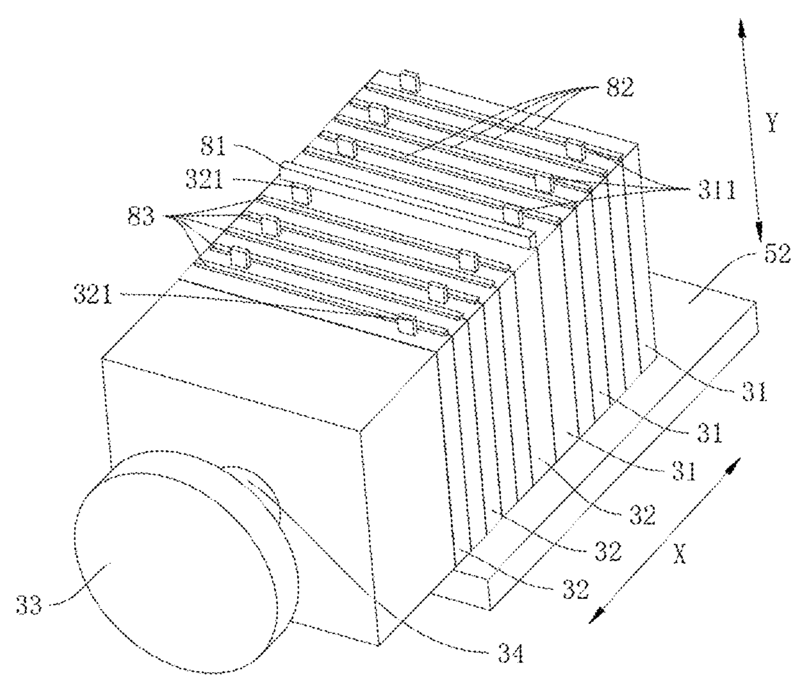
FIG. 12 is a diagram of a structure of another switch assembly of a power converter according to an embodiment.

FIG. 12 is a diagram of a structure of another switch assembly 30 of a power converter 1200 according to an embodiment.

Refer to FIG. 12. The power converter 1200 further includes a first insulating bar 81 disposed on the switch assembly 30. In a first direction X, the first insulating bar 81 is located between a first pin 311 and a second pin 321 that are adjacent to each other. The first insulating bar 81 is disposed between the first pin 311 and the second pin 321 that are adjacent to each other, to increase a creepage distance between the first pin 311 and the second pin 321 that are adjacent to each other, and reduce a probability that a short circuit occurs between the first pin 311 and the second pin 321 that are adjacent to each other.

In an implementation, the first pin 311 and the second pin 321 are located on a side that is of the switch assembly 30 and that is away from a second circuit board 52, and the first insulating bar 81 is disposed on the side that is of the switch assembly 30 and that is away from the second circuit board 52.

It may be understood that in some other implementations, the first pin 311, the second pin 321, and the first insulating bar 81 may alternatively be disposed on another side surface of the switch assembly 30.

In some implementations, the power converter 1200 further includes a second insulating bar 82 and a third insulating bar 83 that are disposed on the side that is of the switch assembly 30 and that is away from the second circuit board 52. In the first direction X, the second insulating bar 82 is located between two adjacent first pins 311, and the third insulating bar 83 is located between two adjacent second pins. A second direction Y is perpendicular to the second circuit board 52. In the second direction Y, a height of the first insulating bar 81 is greater than a height of the second insulating bar 82, and the height of the first insulating bar 81 is greater than a height of the third insulating bar 83. The switch assembly 30 is soldered to the second circuit board 52, so that cables between the switch assembly 30 and a functional module 20 can be reduced, and neatness and aesthetics can be improved. The second insulating bar 82 and the third insulating bar 83 are disposed, so that a creepage distance between adjacent first pins 311 and a creepage distance between adjacent second pins 321 can be increased, and thicknesses, in the first direction X, of a first breaking unit 31 and a second breaking unit 32 can be reduced, thereby effectively reducing a volume of the switch assembly 30. The height of the first insulating bar 81 is greater than the height of the second insulating bar 82, and the height of the first insulating bar 81 is greater than the height of the third insulating bar 83. In this embodiment, only one first insulating bar 81 needs to be disposed, and the rest are the second insulating bar 82 and the third insulating bar 83 whose heights are less than the height of the first insulating bar 81. This helps reduce overall space occupied by the switch assembly 30 and insulating bars on the switch assembly 30.

An embodiment further provides a switch assembly 30. The switch assembly 30 includes a plurality of first breaking units 31, a plurality of second breaking units 32, a connecting rod 34, and a knob 33. The first breaking unit 31 includes a positive input pin, the second breaking unit 32 includes a negative input pin, the plurality of first breaking units 31 are stacked in a first region 301 in a first direction X, the plurality of second breaking units 32 are stacked in a second region 302 in the first direction X, and the first region 301 and the second region 302 are stacked in the first direction X. When rotating, the connecting rod 34 can drive the plurality of first breaking units 31 and the plurality of second breaking units 32 to be turned on or turned off. The knob 33 is connected to the connecting rod 34 and is configured to drive the connecting rod 34 to rotate. For the first breaking unit 31, the second breaking unit 32, the connecting rod 34, the knob 33, the positive input pin, the negative input pin, the first region 301, the second region 302, and the like, refer to the foregoing embodiments. Details are not described herein again.

In this embodiment, the plurality of first breaking units 31 are configured to connect to a same polarity, the plurality of second breaking units 32 are configured to connect to a same polarity, the plurality of first breaking units 31 are located in the first region 301, the plurality of second breaking units 32 are located in the second region 302, and the first region 301 and the second region 302 are stacked. In this way, a probability that the switch assembly 30 in this embodiment is short-circuited can be reduced, and reducing a creepage distance between two adjacent positive input pins and a creepage distance between two adjacent negative input pins can effectively reduce a volume of the switch assembly 30 in this embodiment.

Figure 13:
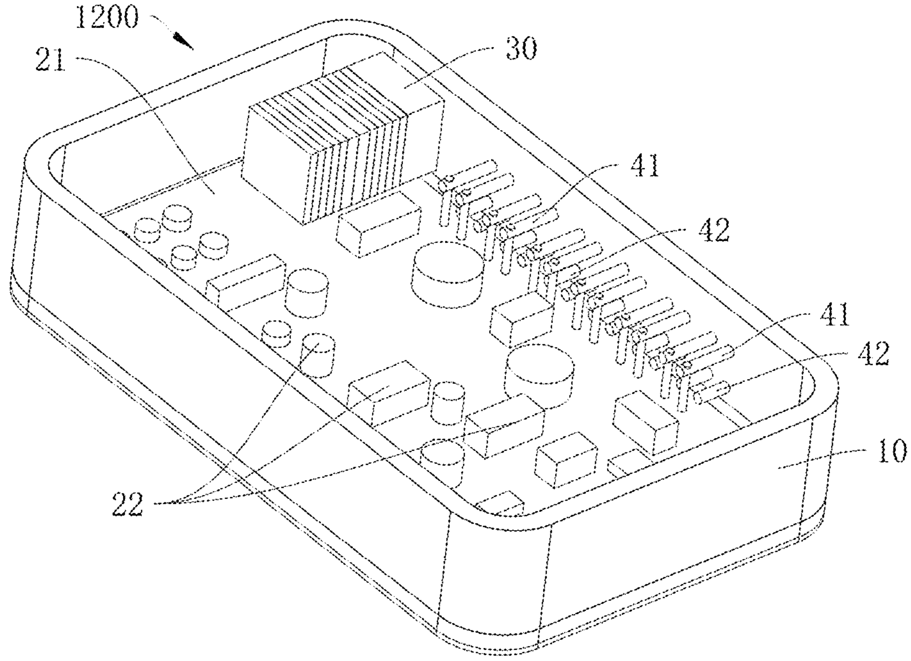
FIG. 13 is a diagram of a partial structure of yet another power converter according to an embodiment.
Figure 14:
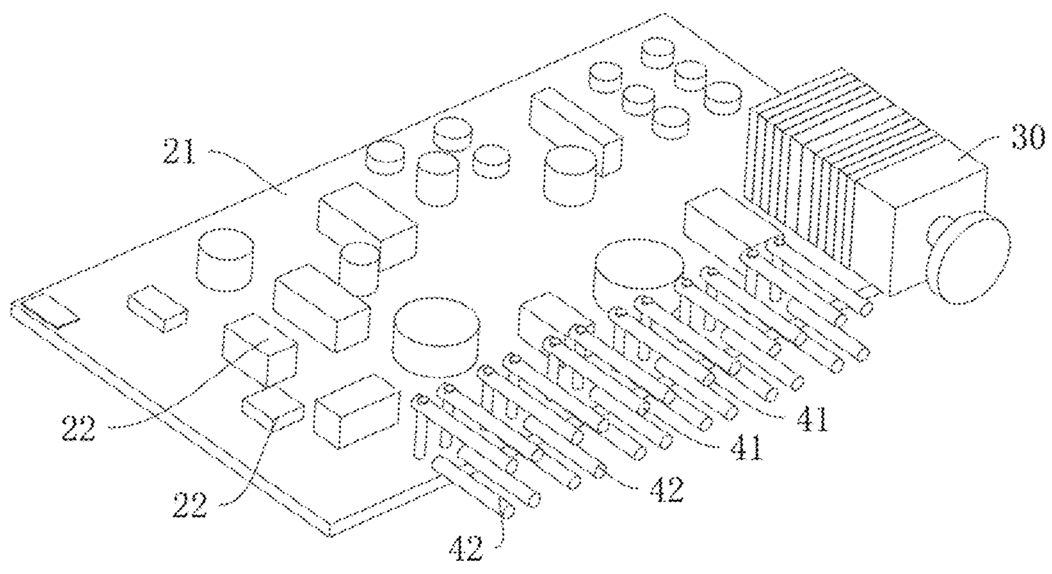
FIG. 14 is a diagram of a partial structure of the power converter in FIG. 13.
Figure 15:
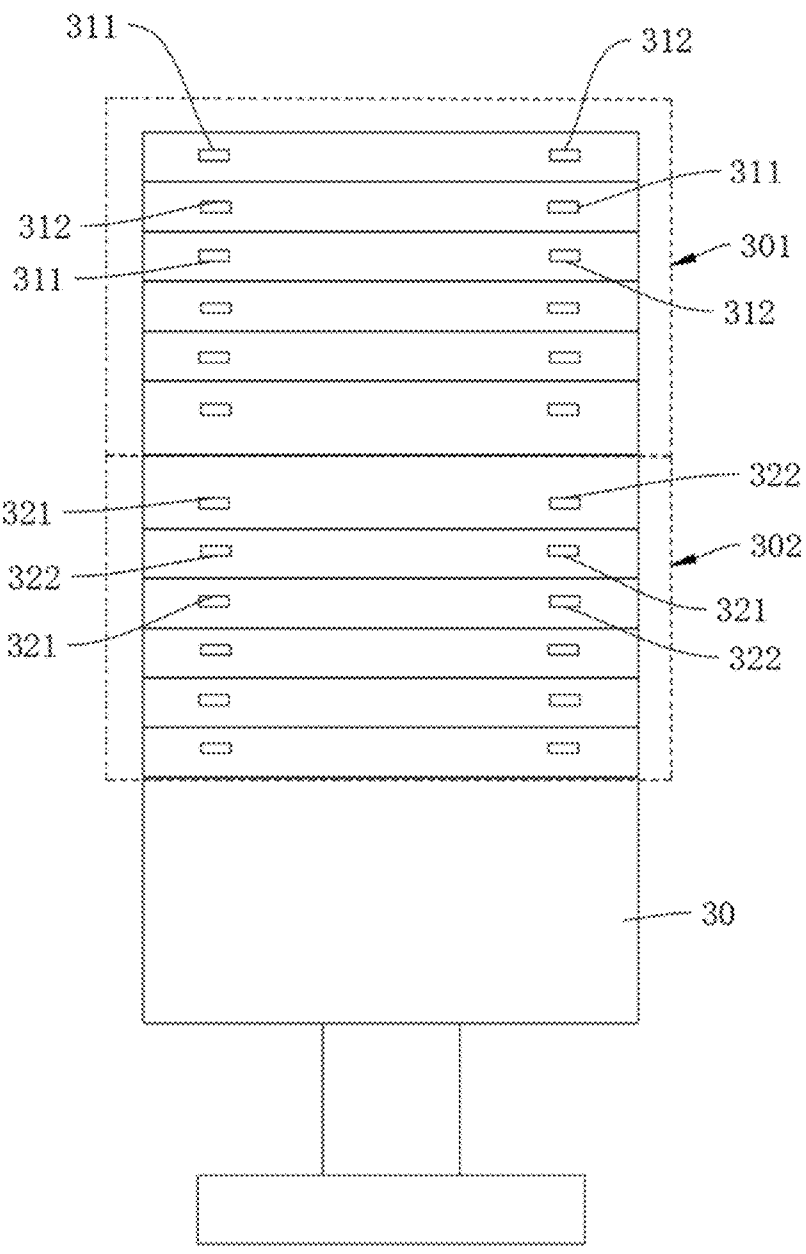
FIG. 15 is a diagram of a structure of a switch assembly of the power converter in FIG. 13.

FIG. 13 is a diagram of a partial structure of yet another power converter 1200 according to an embodiment. FIG. 14 is a diagram of a partial structure of the power converter 1200 in FIG. 13. FIG. 15 is a diagram of a structure of a switch assembly 30 of the power converter 1200 in FIG. 13.

Refer to FIG. 13 to FIG. 15. The power converter 1200 includes a housing 10, a circuit mainboard 21, a plurality of positive input ports 41, a plurality of negative input ports 42, and a switch assembly 30. For the housing 10, a power device 22, the plurality of positive input ports 41, and the plurality of negative input ports 42, refer to the foregoing embodiments. Details are not described herein again. A main difference between the power converter 1200 in this embodiment and the power converter 1200 in the foregoing embodiments lies in that the power converter 1200 in this embodiment only includes the circuit mainboard 21, and does not include the first circuit board 51 and the second circuit board 52 described above.

The power device 22 and the switch assembly 30 are located on the circuit mainboard 21 and are electrically connected to traces on the circuit mainboard 21. Some of the plurality of positive input ports 41 and the plurality of negative input ports 42 are directly soldered to the circuit mainboard 21 and are electrically connected to traces on the circuit mainboard 21, and some of the plurality of positive input ports 41 and the plurality of negative input ports 42 are indirectly electrically connected to traces on the circuit mainboard 21 through conductors. For example, the plurality of positive input ports 41 and the plurality of negative input ports 42 are electrically connected to the switch assembly 30 through traces on the circuit mainboard 21, and the switch assembly 30 is electrically connected to the power device 22 through a trace on the circuit mainboard 21. In this embodiment, both the power device 22 and the switch assembly 30 are located on the circuit mainboard 21. This can reduce complexity and maintenance costs of a system, and provide a higher integration level and a compact size. In addition, there is only one circuit mainboard 21, and communication and control interfaces are relatively simple and easy to manage.

In some implementations, the switch assembly 30 includes a plurality of first pins 311, a plurality of first insert pins 312, a plurality of second pins 321, and a plurality of second insert pins 322. For the plurality of first pins 311, the plurality of first insert pins 312, the plurality of second pins 321, and the plurality of second insert pins 322, refer to the foregoing embodiments. Details are not described herein again. A main difference from the foregoing embodiments lies in that the plurality of first pins 311, the plurality of first insert pins 312, the plurality of second pins 321, and the plurality of second insert pins 322 are all located on a side that is of the switch assembly 30 and that faces the circuit mainboard 21, and the plurality of first pins 311, the plurality of first insert pins 312, the plurality of second pins 321, and the plurality of second insert pins 322 are all inserted into the circuit mainboard 21 to be electrically connected to traces on the circuit mainboard 21. For example, the plurality of first pins 311, the plurality of first insert pins 312, the plurality of second pins 321, and the plurality of second insert pins 322 all protrude from a side surface that is of the switch assembly 30 and that faces the circuit mainboard 21. Because FIG. 15 is a top view of the switch assembly 30, it is not shown that the plurality of first pins 311, the plurality of first insert pins 312, the plurality of second pins 321, and the plurality of second insert pins 322 all protrude from the side surface that is of the switch assembly 30 and that faces the circuit mainboard 21. In this implementation, the plurality of first pins 311, the plurality of first insert pins 312, the plurality of second pins 321, and the plurality of second insert pins 322 are all inserted into the circuit mainboard 21 and are electrically connected to traces on the circuit mainboard 21, the positive input port 41 is electrically connected to the first pin 311 through a trace on the circuit mainboard 21, the first insert pin 312 is electrically connected to the power device 22 through a trace on the circuit mainboard 21, the negative input port 42 is electrically connected to the second pin 321 through a trace on the circuit mainboard 21, and the second insert pin 322 is electrically connected to the power device 22 through a trace on the circuit mainboard 21. In this implementation, the cable in the foregoing embodiments may be replaced with the trace on the circuit mainboard 21, so that difficulty in cable routing is reduced and the entire power converter 1200 is neater or more neat.

In some implementations, the plurality of first pins 311 and the plurality of first insert pins 312 are all located in a first region 301, and the plurality of second pins 321 and the plurality of second insert pins 322 are all located in a second region 302. Because the first pin 311 and the first insert pin 312 are connected to the positive input port 41 and are a same polarity, a short circuit can be avoided when condensation occurs between the plurality of first pins 311 and the plurality of first insert pins 312. Similarly, because the plurality of second pins 321 and the plurality of second insert pins 322 are all located in the second region 302, are connected to the negative input ports 42, and are a same polarity, a short circuit can be avoided when condensation occurs between the plurality of second pins 321 and the plurality of second insert pins 322.

The foregoing descriptions are merely implementations of the embodiments, but are not intended to limit their scope. Any variation or replacement readily figured out by a person skilled in the art shall fall within the scope of the embodiments.

What is claimed is:

1. A power generation system, comprising:

a plurality of positive input ports;

a plurality of negative input ports;

a switch assembly further comprising:

a plurality of first pins located in a first region; and a plurality of second pins located in a second region, wherein the first region and the second region are stacked in a first direction, each first pin is electrically connected to a respective positive input port, each second pin is electrically connected to a respective negative input port, the plurality of positive input ports and the plurality of negative input ports are configured to electrically connect the switch assembly to an external direct current source;

a circuit mainboard;

a power device, wherein the power device is disposed on the circuit mainboard and the switch assembly is electrically connected to the power device through a trace on the circuit mainboard; and a controller being configured to send a switch-off signal to the switch assembly when the external direct current source or the power device is faulty, to disconnect a circuit between the plurality of positive input ports and the power device or a circuit between the plurality of negative input ports and the power device.

2. The power generation system according to claim 1, wherein a first pin closest to the second region in the first region is a pin 1, a second pin closest to the first region in the second region is a pin 2, and the pin 1 and the pin 2 are disposed in a staggered manner in the first direction.

3. The power generation system according to claim 1, wherein there are two first regions, at least two first pins are disposed in each of the two first regions, and the two first regions are located on two opposite sides of the second region.

4. The power generation system according to claim 1, wherein there are two second regions, at least two second pins are disposed in each of the two second regions, and the two second regions are located on two opposite sides of the first region.

5. The power generation system according to claim 1, wherein the switch assembly further comprises:

a plurality of first breaking units, wherein each first breaking unit comprises a respective first pin; and a plurality of second breaking units, wherein each second breaking unit comprises a respective second pin, the plurality of first breaking units is stacked in the first region in the first direction, and the plurality of second breaking units is stacked in the second region in the first direction.

6. The power generation system according to claim 5, wherein a distance, in the first direction, between two adjacent first pins is L1; a distance, in the first direction, between two adjacent second pins is L2; and a distance, in the first direction, between the first pin and the second pin that are adjacent to each other is L3, wherein L1<L3, and L2<L3.

7. The power generation system according to claim 5, further comprising:

a first insulating bar disposed on the switch assembly, wherein, in the first direction, the first insulating bar is located between the first pin and the second pin that are adjacent to each other.

8. The power generation system according to claim 1, wherein perpendicular projections of two adjacent first pins on a reference plane are spaced from each other, and the reference plane is perpendicular to the first direction.

9. The power generation system according to claim 1, further comprising:

a plurality of first cables bundled together, wherein the plurality of first cables is electrically connected to the plurality of first pins in a one-to-one correspondence, and each first cable is electrically connected between a respective first pin and a respective positive input port; and a plurality of second cables bundled together, wherein the plurality of second cables is electrically connected to the plurality of second pins in a one-to-one correspondence, and each second cable is electrically connected between a respective second pin and a respective negative input port.

10. The power generation system according to claim 9, further comprising:

a plurality of positive combiner ports, wherein each positive combiner port is electrically connected to at least two positive input ports and electrically connected to a respective first cable; and a plurality of negative combiner ports, wherein each negative combiner port is electrically connected to at least two negative input ports and electrically connected to a respective second cable.

11. The power generation system according to claim 10, further comprising:

a first circuit board;

a plurality of branch current detectors; and a plurality of main circuit current detectors, wherein the plurality of branch current detectors are integrated on the first circuit board, the plurality of positive input ports, the plurality of negative input ports, the plurality of positive combiner ports, and the plurality of negative combiner ports are all soldered to the first circuit board, each branch current detector is configured to detect an input current of a respective positive input port and an input current of a respective negative input port, and each main circuit current detector is configured to detect an outflow current of a respective positive combiner port and an outflow current of a respective negative combiner port.

12. The power generation system according to claim 1, further comprising:

a second circuit board, and the switch assembly further comprises:

a plurality of first insert pins, wherein the plurality of first insert pins is in a one-to-one correspondence with the plurality of first pins at an input end of the switch assembly and an output end of the switch assembly; and a plurality of second insert pins, wherein the plurality of second insert pins is in a one-to-one correspondence with the plurality of second pins at an input end and an output end of the switch assembly, the switch assembly is in insertion connection to the second circuit board by using the first insert pins and the second insert pins and is electrically connected to a trace on the second circuit board, and the second circuit board is electrically connected to the circuit mainboard through a wire.

13. The power generation system according to claim 1, wherein the switch assembly further comprises:

a plurality of first insert pins, wherein the plurality of first insert pins is in a one-to-one correspondence with the plurality of first pins, at an input end and an output end of the switch assembly; and a plurality of second insert pins, wherein the plurality of second insert pins is in a one-to-one correspondence with the plurality of second pins at an input end and an output end of the switch assembly; and the switch assembly is disposed on the circuit mainboard, the plurality of first pins, the plurality of first insert pins, the plurality of second pins, and the plurality of second insert pins are all located on a side of the switch assembly that faces the circuit mainboard, the switch assembly is in insertion connection to the circuit mainboard by using the plurality of first pins, the plurality of first insert pins, the plurality of second pins, and the plurality of second insert pins and is electrically connected to a trace on the circuit mainboard, the plurality of positive input ports and the plurality of negative input ports are electrically connected to traces on the circuit mainboard, and the plurality of first pins and the plurality of second pins are electrically connected to the plurality of positive input ports, the plurality of negative input ports, and the power device through traces on the circuit mainboard.

14. A power converter, comprising:

a housing comprising a bottom housing and a cover plate, wherein the bottom housing and the cover plate enclose an accommodating cavity;

a circuit mainboard disposed in the accommodating cavity;

a power device fastened to the circuit mainboard by using a pin;

an input connector comprising a plurality of positive input ports and a plurality of negative input ports, wherein the input connector is installed on the housing and is configured to connect to an external direct current source; and a switch assembly installed on the housing, wherein one part of the switch assembly is located inside the accommodating cavity, the other part of the switch assembly is located outside the accommodating cavity, the switch assembly is electrically connected between the input connector and the power device, the switch assembly further comprises:

a plurality of first pins located in a first region; and a plurality of second pins located in a second region, wherein the first region and the second region are stacked in a first direction, each first pin is electrically connected to a respective positive input port, each second pin is electrically connected to a respective negative input port, and the power converter is configured to control the switch assembly to implement connection or disconnection between the input connector and the power device.

15. The power converter according to claim 14, wherein a first pin closest to the second region in the first region is a pin 1, a second pin closest to the first region in the second region is a pin 2, and the pin 1 and the pin 2 are disposed in a staggered manner in the first direction.

16. The power converter according to claim 14, wherein there are two first regions, at least two first pins are disposed in each of the two first regions, and the two first regions are located on two opposite sides of the second region.

17. The power converter according to claim 14, wherein there are two second regions, at least two second pins are disposed in each of the two second regions, and the two second regions are located on two opposite sides of the first region.

18. The power converter according to claim 14, wherein the switch assembly further comprises:

a plurality of first breaking units, wherein each first breaking unit comprises a respective first pin; and a plurality of second breaking units, wherein each second breaking unit comprises a respective second pin, the plurality of first breaking units are stacked in the first region in the first direction, and the plurality of second breaking units are stacked in the second region in the first direction.

19. The power converter according to claim 18, wherein a distance, in the first direction, between two adjacent first pins is L1; a distance, in the first direction, between two adjacent second pins is L2; and a distance, in the first direction, between the first pin and the second pin that are adjacent to each other is L3, wherein L1<L3, and L2<L3.

20. A switch assembly comprising:

a plurality of first breaking units, wherein each first breaking unit comprises a respective positive input pin;

a plurality of second breaking units, wherein each second breaking unit comprises a respective negative input pin, wherein the plurality of first breaking units is stacked in a first region in a first direction, the plurality of second breaking units is stacked in a second region in the first direction, and the first region and the second region are stacked in the first direction;

a connecting rod, wherein, when rotating, the connecting rod is configured to drive the plurality of first breaking units and the plurality of second breaking units to be turned on or turned off; and a knob, wherein the knob is connected to the connecting rod and is configured to drive the connecting rod to rotate.

* * * * *